(12) United States Patent
Wang et al.

(10) Patent No.: US 11,152,270 B2
(45) Date of Patent: Oct. 19, 2021

(54) MONITORING STRUCTURE FOR CRITICAL DIMENSION OF LITHOGRAPHY PROCESS

(71) Applicant: Winbond Electronics Corp., Taichung (TW)

(72) Inventors: Li-Chien Wang, Taichung (TW); Cheng-Hsiang Liu, Taichung (TW); Meng-Hsien Tsai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 52 days.

(21) Appl. No.: 16/699,697

(22) Filed: Dec. 1, 2019

(65) Prior Publication Data

US 2021/0166983 A1  Jun. 3, 2021

(51) Int. Cl.
*H01L 23/58* (2006.01)
*H01L 21/66* (2006.01)
*G03F 7/20* (2006.01)

(52) U.S. Cl.
CPC .......... *H01L 22/34* (2013.01); *G03F 7/70625* (2013.01)

(58) Field of Classification Search
CPC .............................. H01L 22/34; G03F 7/70625
See application file for complete search history.

(56) References Cited

U.S. PATENT DOCUMENTS

| | | | | | |
|---|---|---|---|---|---|
| 5,459,093 | A | * | 10/1995 | Kuroda | H01L 27/0207 438/599 |
| 5,766,809 | A | * | 6/1998 | Bae | G03F 7/70633 430/22 |
| 6,133,062 | A | * | 10/2000 | Pai | H01L 27/14621 257/E27.134 |
| 7,927,782 | B2 | * | 4/2011 | Aton | H01L 21/28123 430/313 |
| 8,647,892 | B2 | | 2/2014 | Liang et al. | |
| 9,024,407 | B2 | | 5/2015 | Huang et al. | |
| 9,739,702 | B2 | | 8/2017 | Bringoltz et al. | |
| 2004/0033689 | A1 | * | 2/2004 | Ho | H01L 21/76229 438/687 |
| 2005/0127460 | A1 | * | 6/2005 | Saito | H01L 29/495 257/412 |
| 2006/0050283 | A1 | * | 3/2006 | Hill | G03F 7/70633 356/512 |
| 2009/0087754 | A1 | * | 4/2009 | Aton | G03F 1/26 430/5 |
| 2017/0255112 | A1 | | 9/2017 | Van Leest et al. | |

FOREIGN PATENT DOCUMENTS

TW    I651598    2/2019

* cited by examiner

*Primary Examiner* — Caleb E Henry
(74) *Attorney, Agent, or Firm* — JCIPRNET

(57) ABSTRACT

A monitoring structure for a critical dimension of a lithography process including a dummy pattern layer and a patterned photoresist layer is provided. The dummy pattern layer includes a dummy pattern. The patterned photoresist layer includes at least one monitoring mark located above the dummy pattern. The monitoring mark includes a first portion and a second portion that intersect each other. The first portion extends in a first direction, the second portion extends in a second direction, and the first direction intersects the second direction.

20 Claims, 25 Drawing Sheets

MONITORING STRUCTURE FOR CRITICAL DIMENSION OF LITHOGRAPHY PROCESS

BACKGROUND

Field of the Invention

The invention relates to a monitoring structure and more particularly, to a monitoring structure for a critical dimension of a lithography process.

Description of Related Art

A critical dimension is a key parameter in a lithography process. However, in a scenario that a target size of a component is much greater than the critical dimension of the lithography process, it will be unable to accurately determine whether the process capability of a machine is varied.

Thus, a current method is to dispose monitoring marks for monitoring the the critical dimension of the lithography process above a wafer. As the monitoring marks have sizes close to the critical dimension of the lithography process, whether the process capability of a machine (e.g., an exposure apparatus) is varied may be determined.

However, because the critical dimension for the monitoring marks above different locations of the wafer has a poor uniformity, it is likely to cause misjudgment.

SUMMARY

The invention provides a monitoring structure for a critical dimension of a lithography process which is capable of effectively improving a uniformity of a critical dimension for monitoring marks.

A monitoring structure for a critical dimension of a lithography process including a dummy pattern layer and a patterned photoresist layer is provided. The dummy pattern layer includes a dummy pattern. The patterned photoresist layer includes at least one monitoring mark located above the dummy pattern. The monitoring mark includes a first portion and a second portion that intersect each other. The first portion extends in a first direction, the second portion extends in a second direction, and the first direction intersects the second direction.

Based on the above, in the monitoring structure for the critical dimension in the lithography process provided by the embodiments of the invention, because the dummy pattern is located under the at least one monitoring mark, an environment under the at least one monitoring mark can be similar to that of a chip region. Thereby, the uniformity of the critical dimension for the at least one monitoring mark above different locations of the wafer can be effectively improved, and the misjudgment caused by the poor uniformity of the critical dimension for the at least one monitoring mark can be prevented. In this way, the critical dimension of the lithography process can be effectively monitored and controlled, and whether the process capability of the machine (e.g., the exposure apparatus) is varied can be determined.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
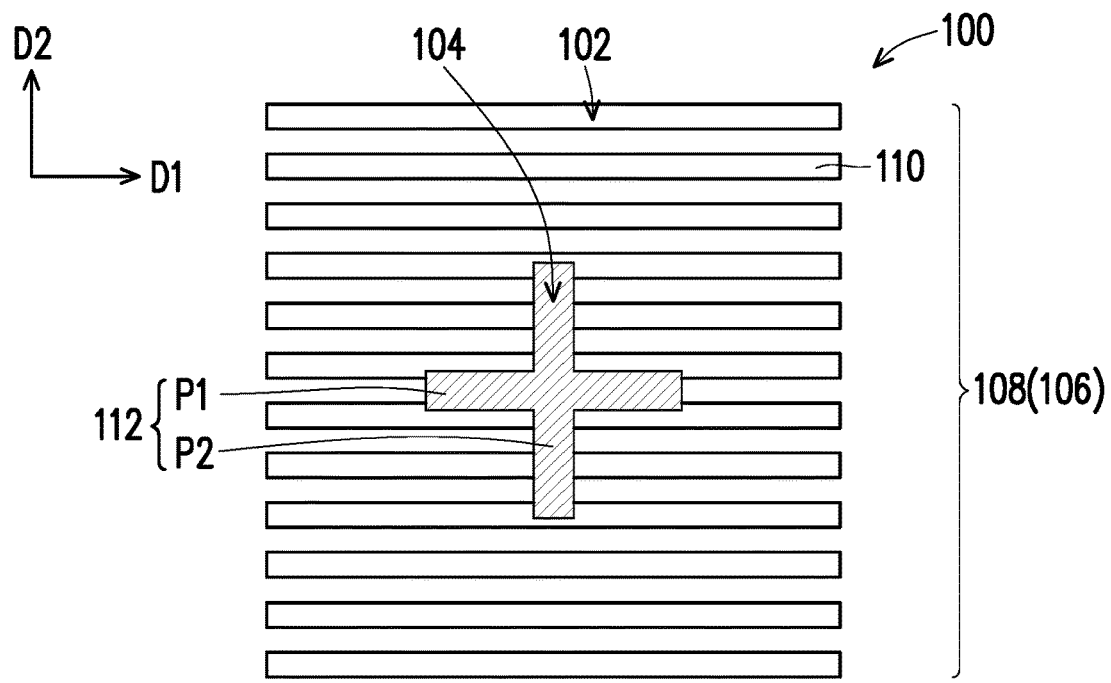
FIG. 1A to FIG. 1X are schematic views of a monitoring structure for a critical dimension of a lithography process according to some embodiments of the invention.
Figure 1B:
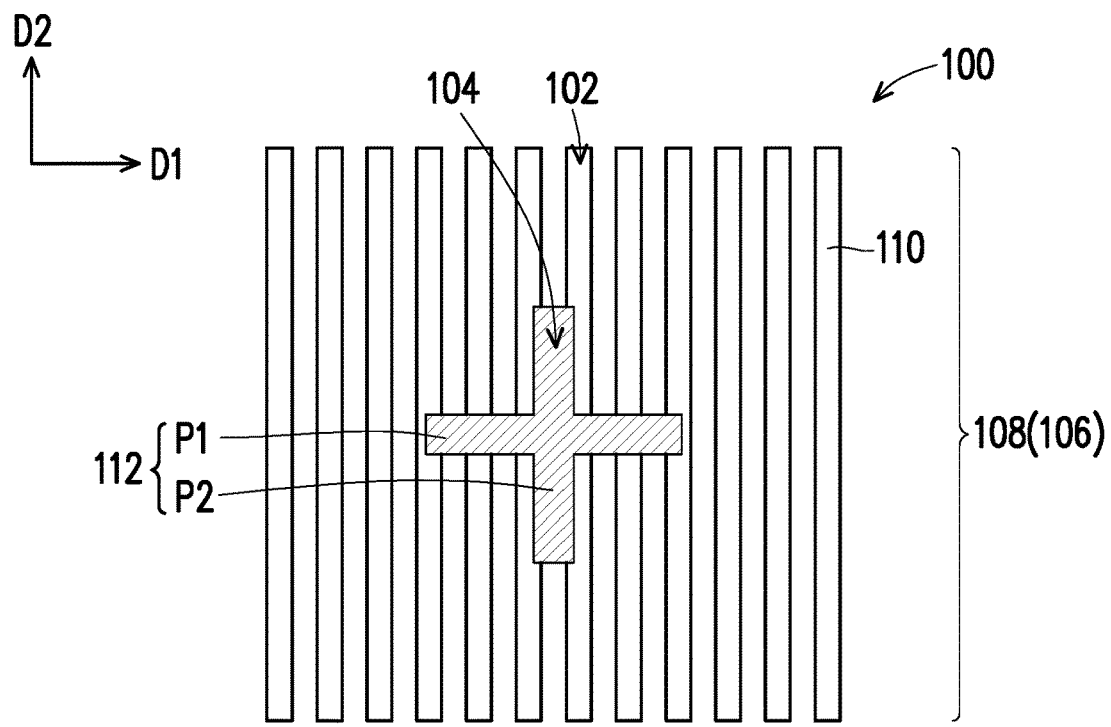
Figure 1C:
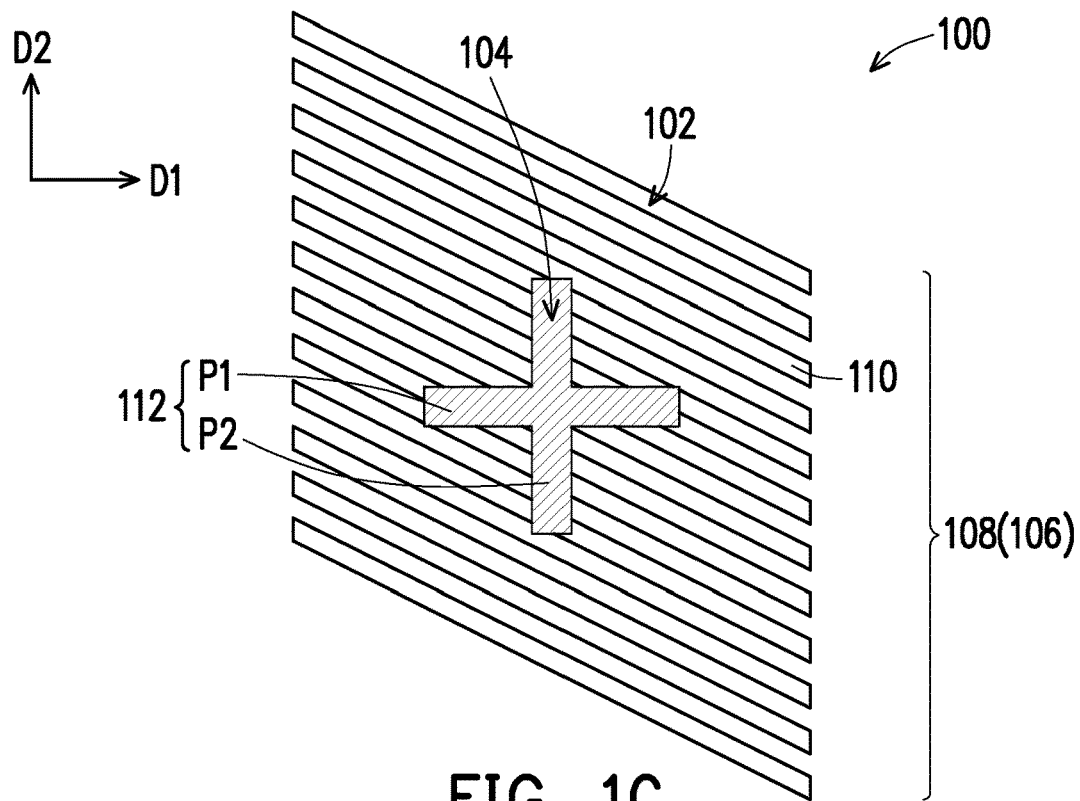
Figure 1D:
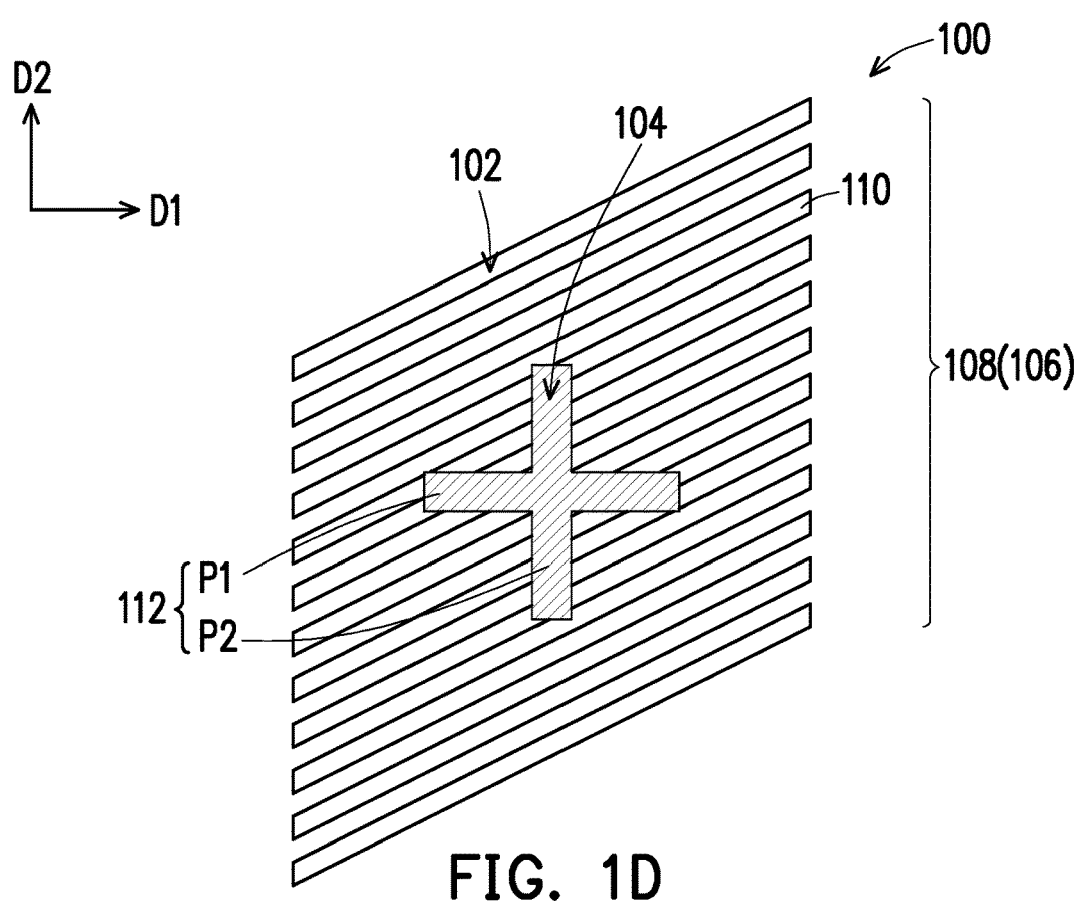
Figure 1E:
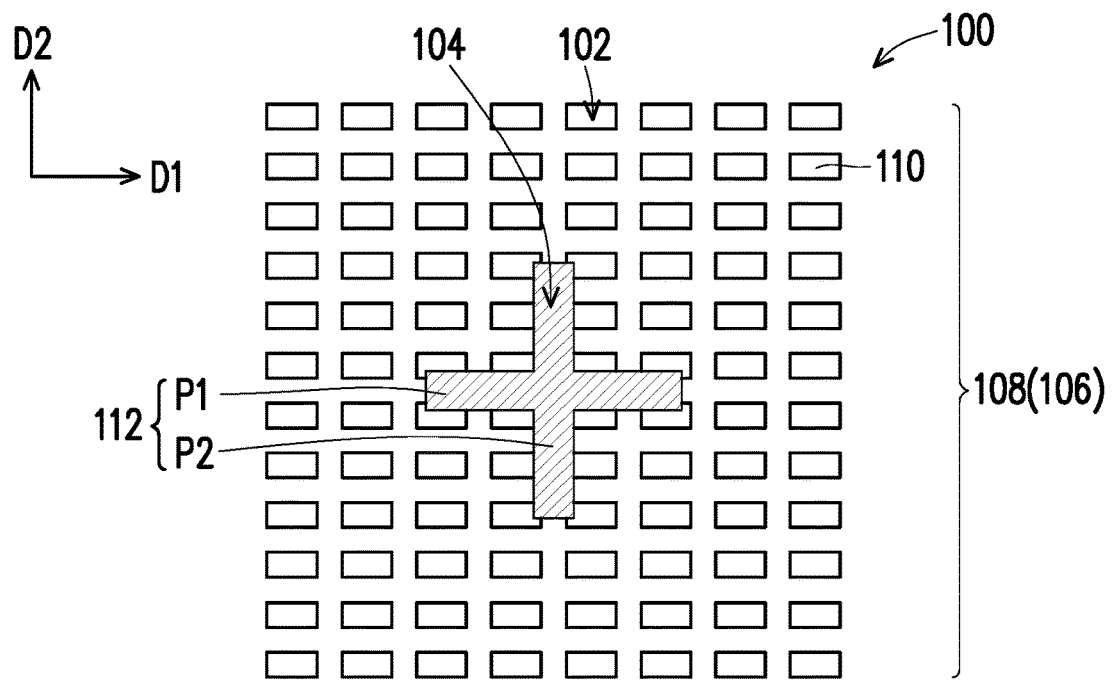
Figure 1F:
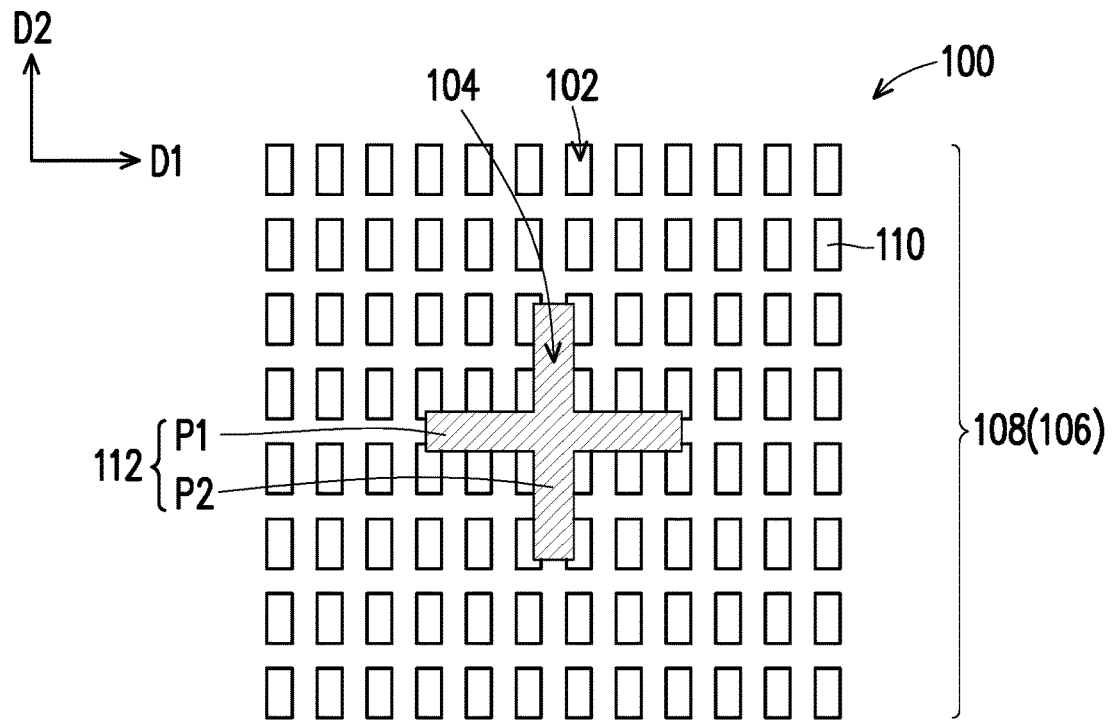
Figure 1G:
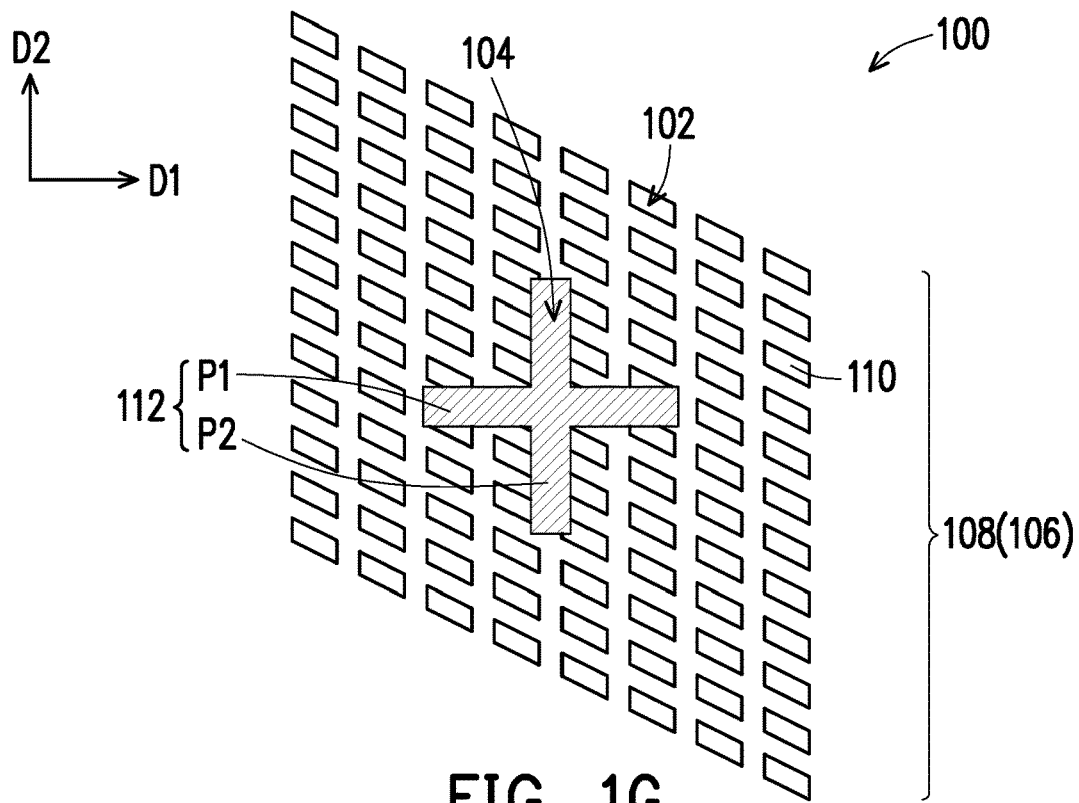
Figure 1H:
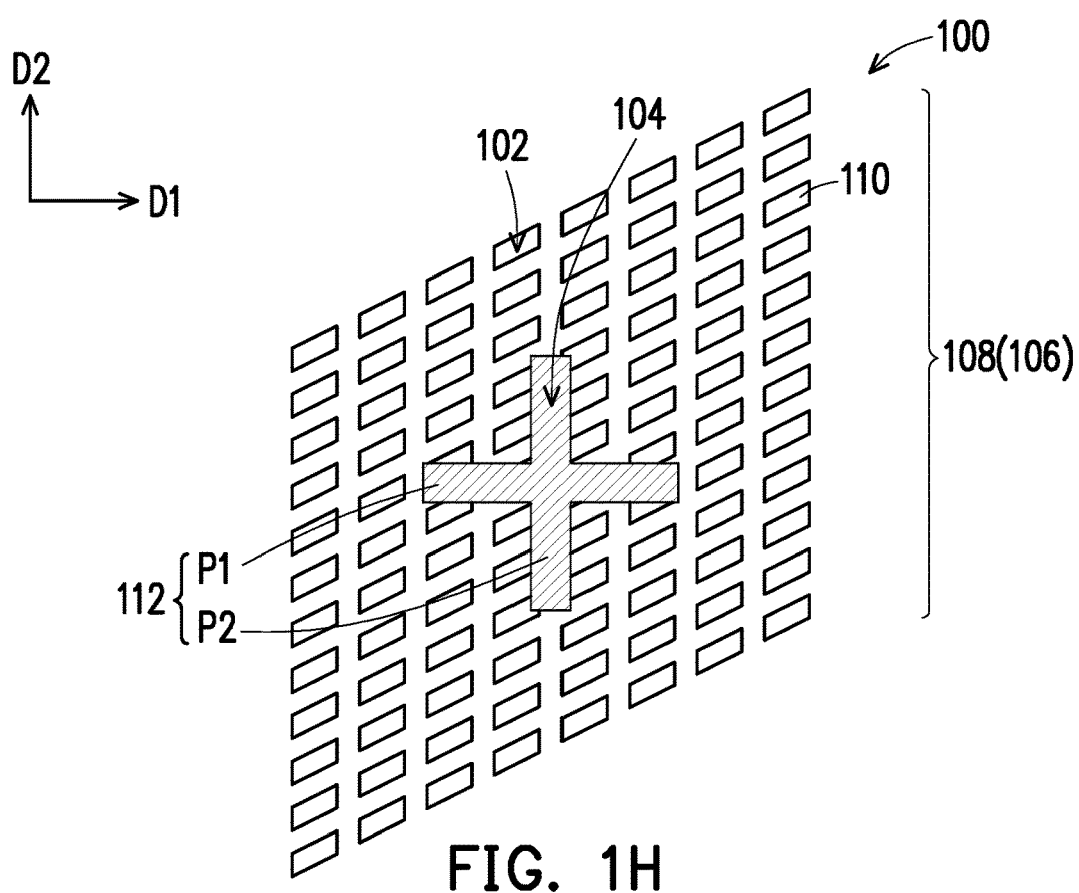
Figure 1I:
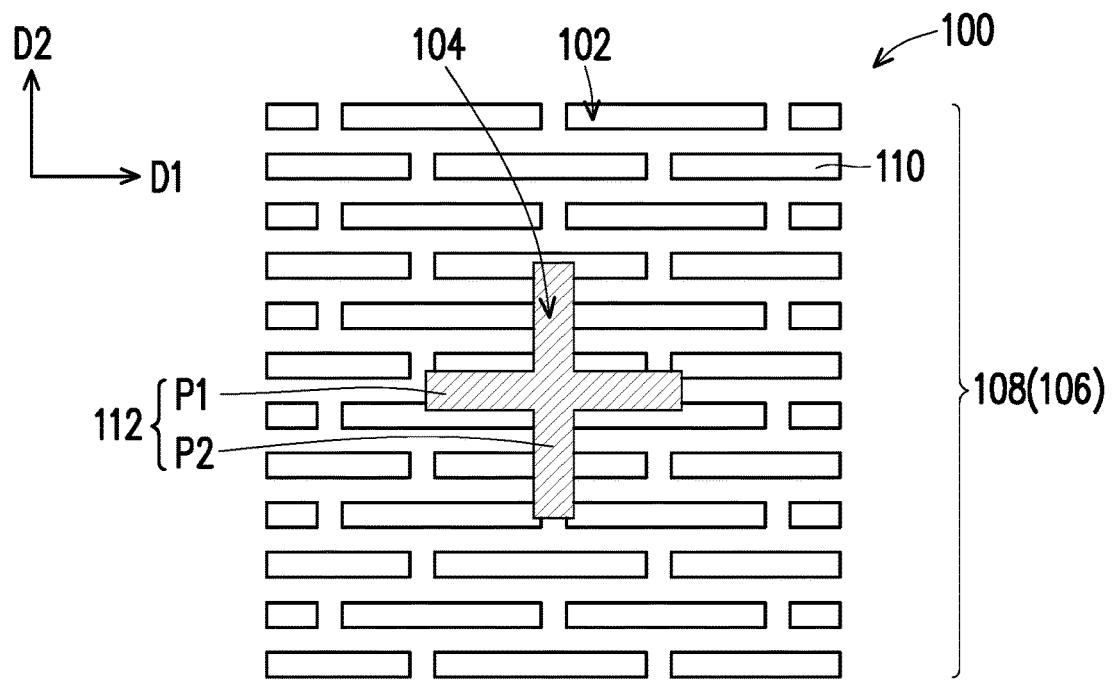
Figure 1J:
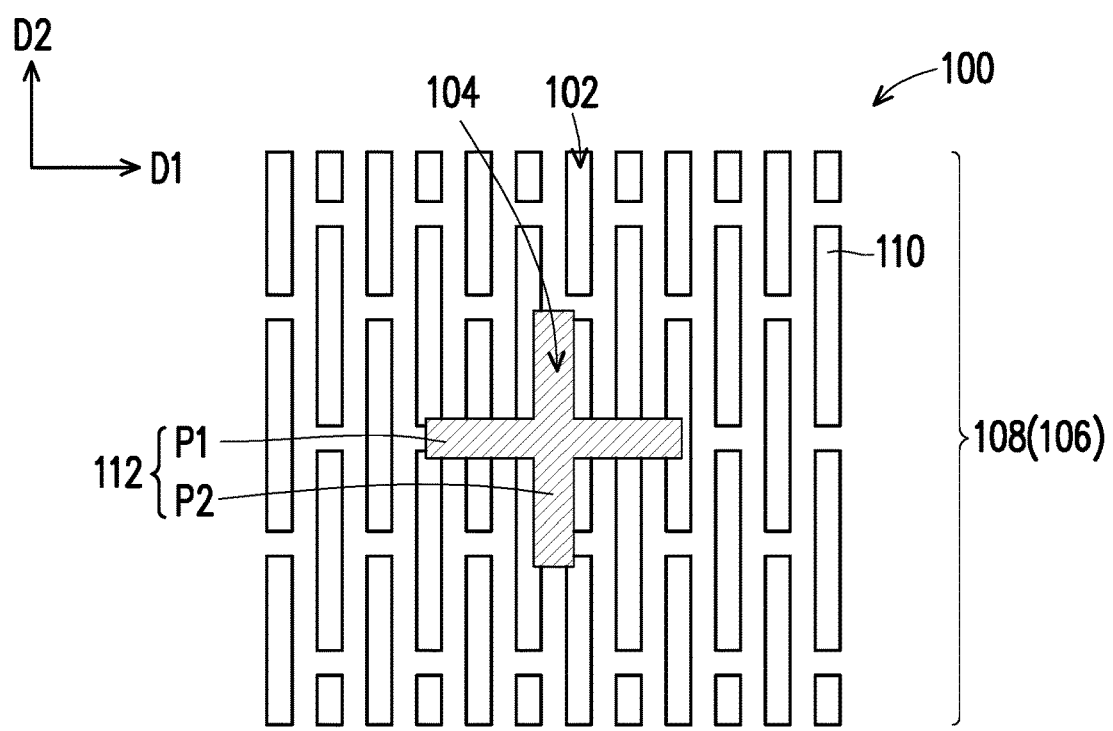
Figure 1K:
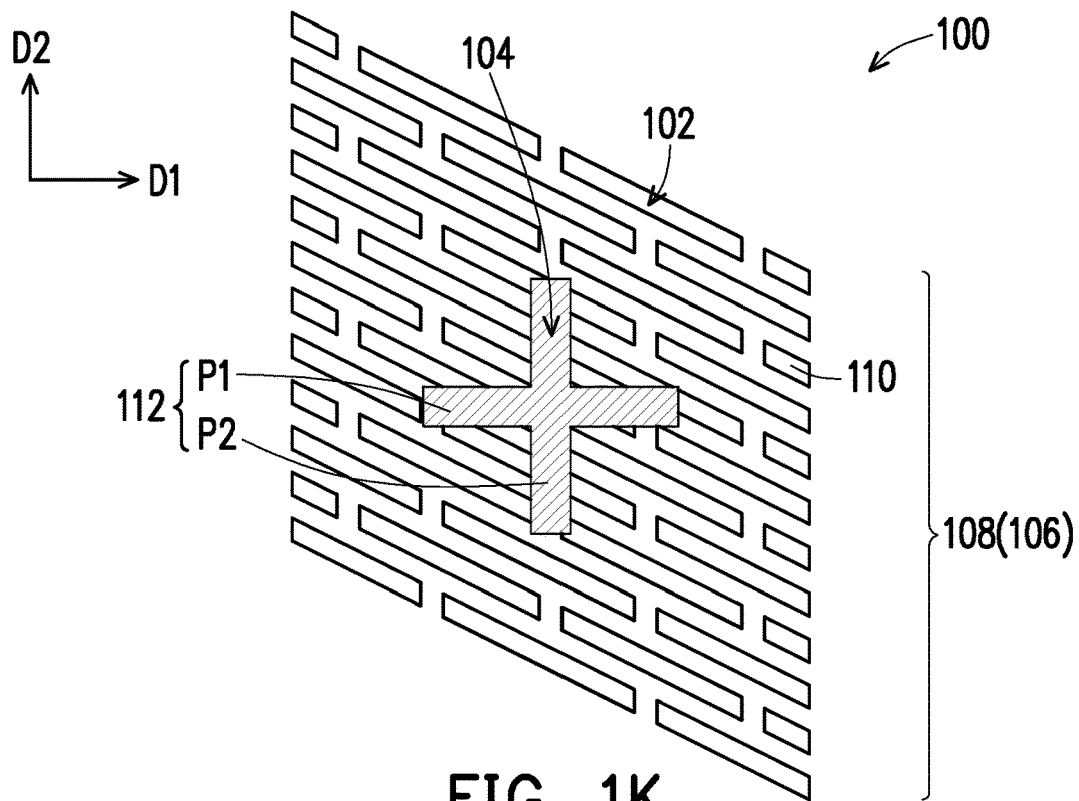
Figure 1L:
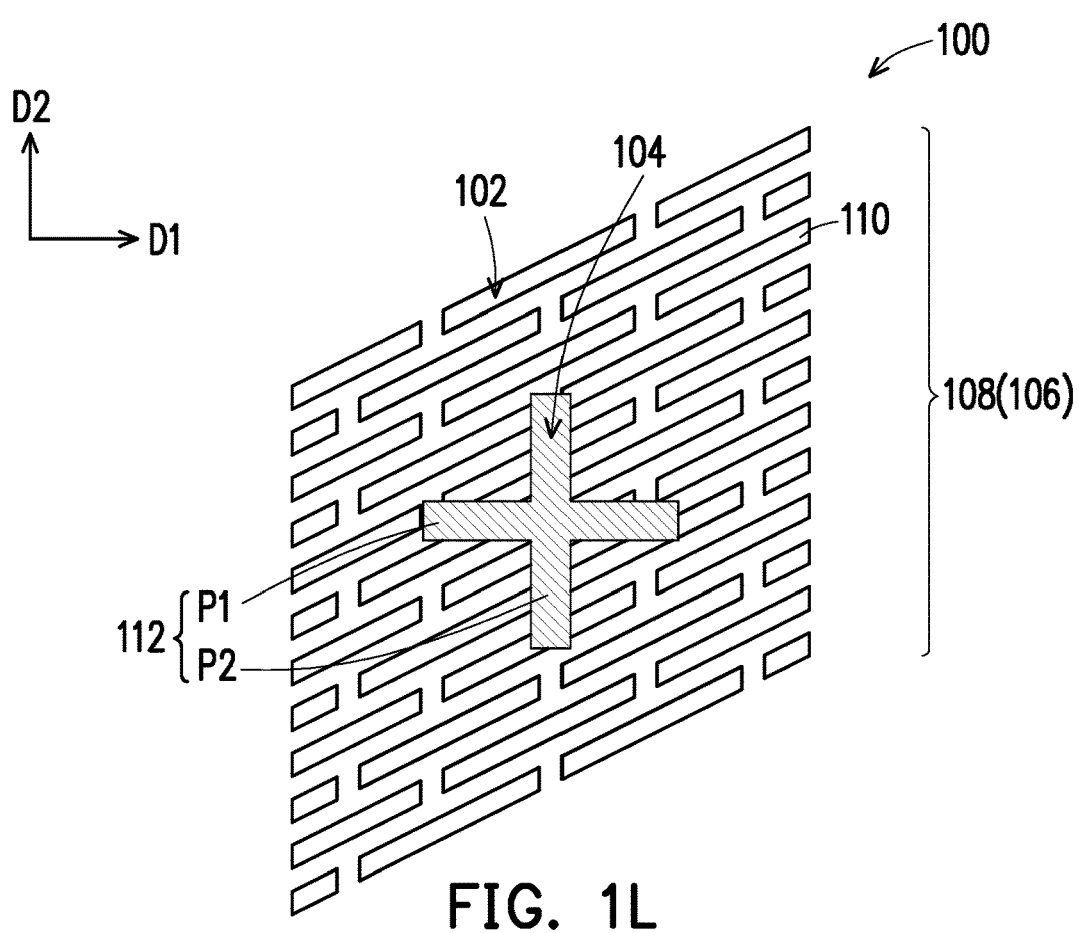
Figure 1M:
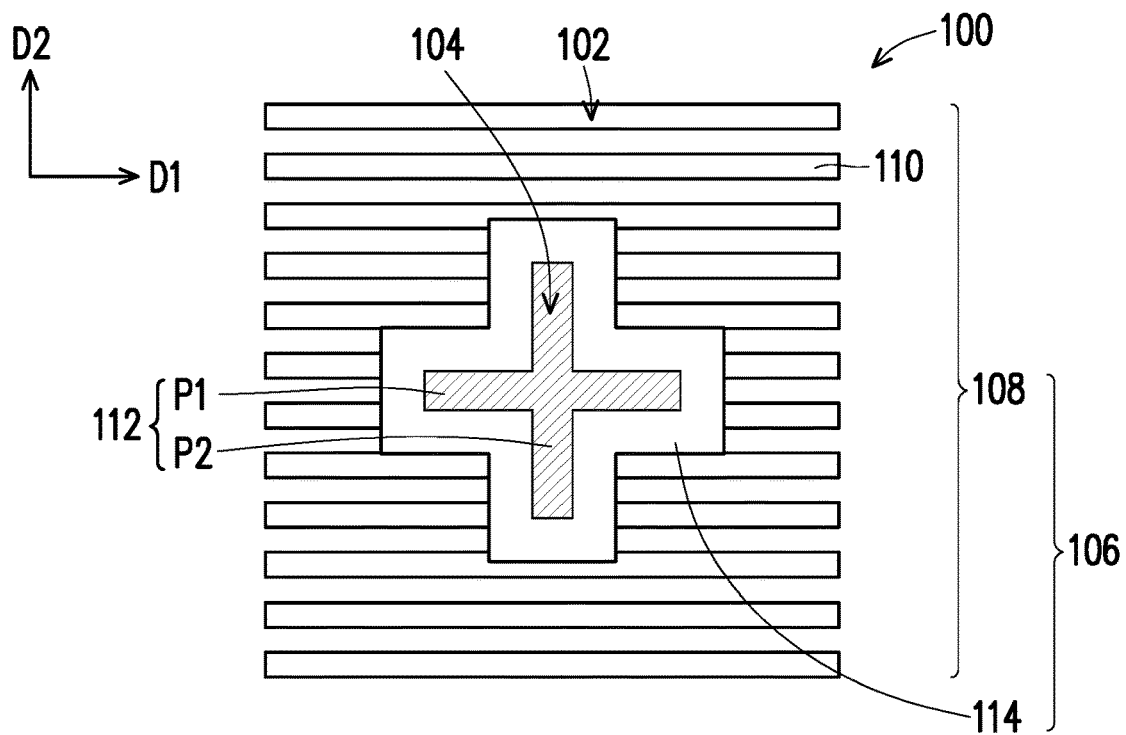
Figure 1N:
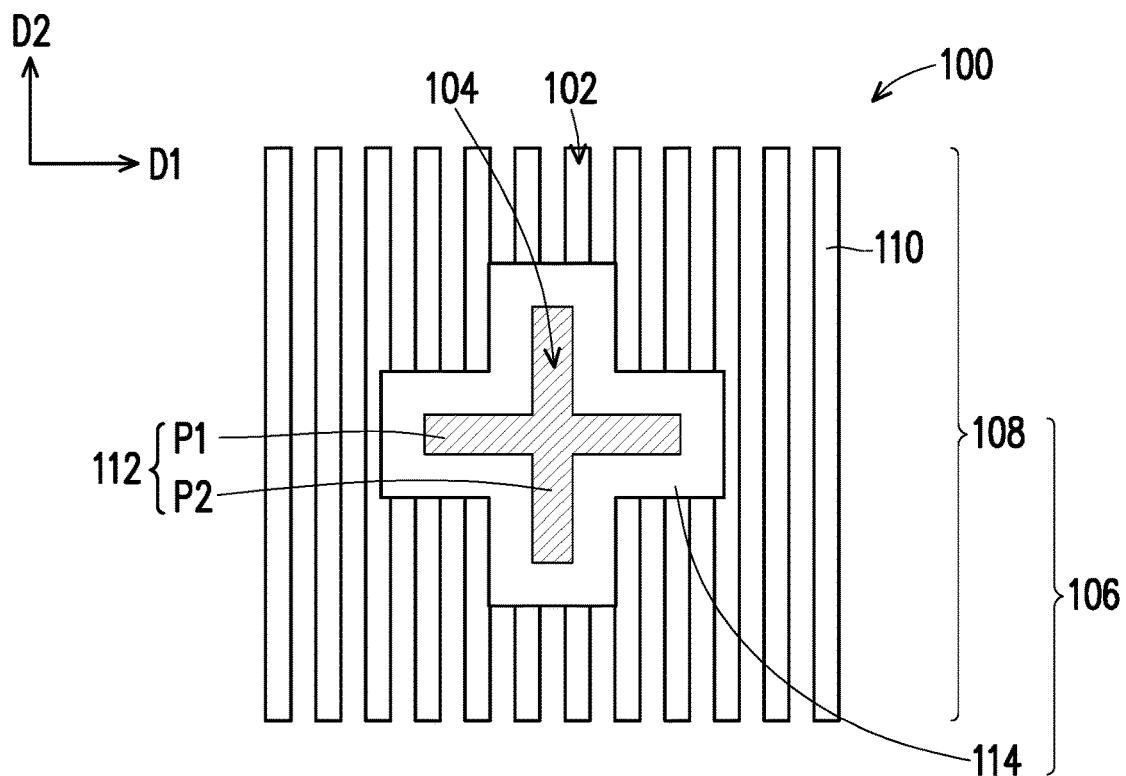
Figure 1O:
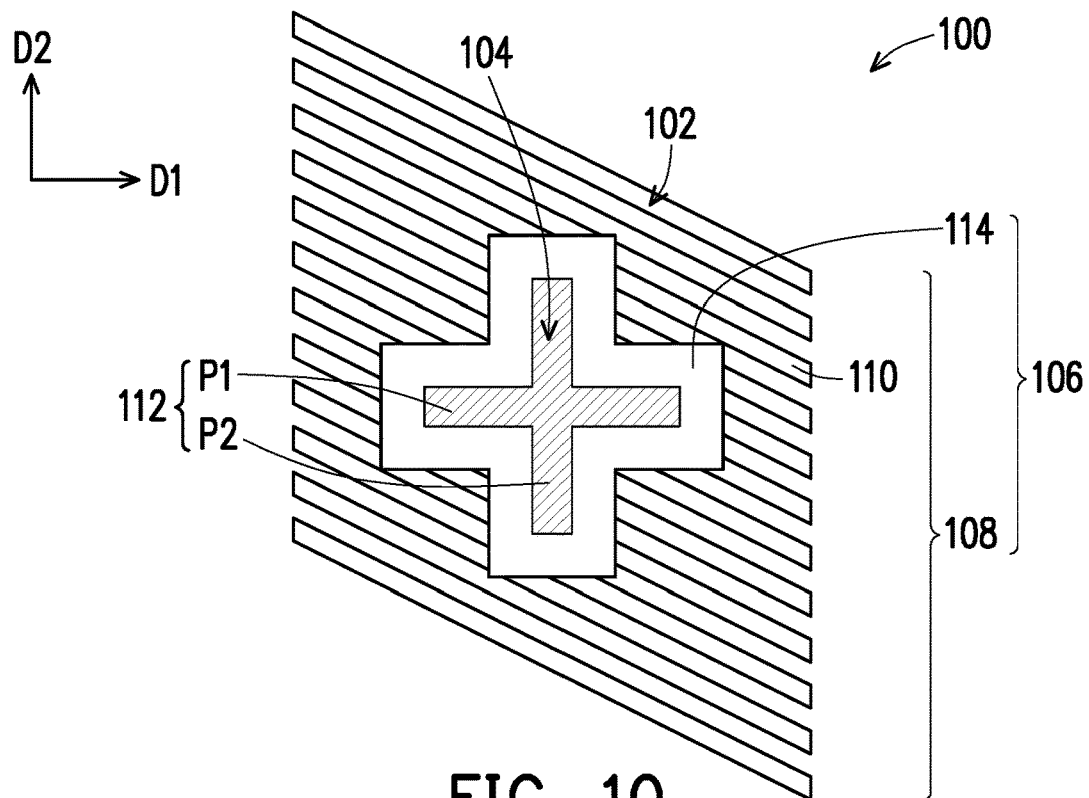
Figure 1P:
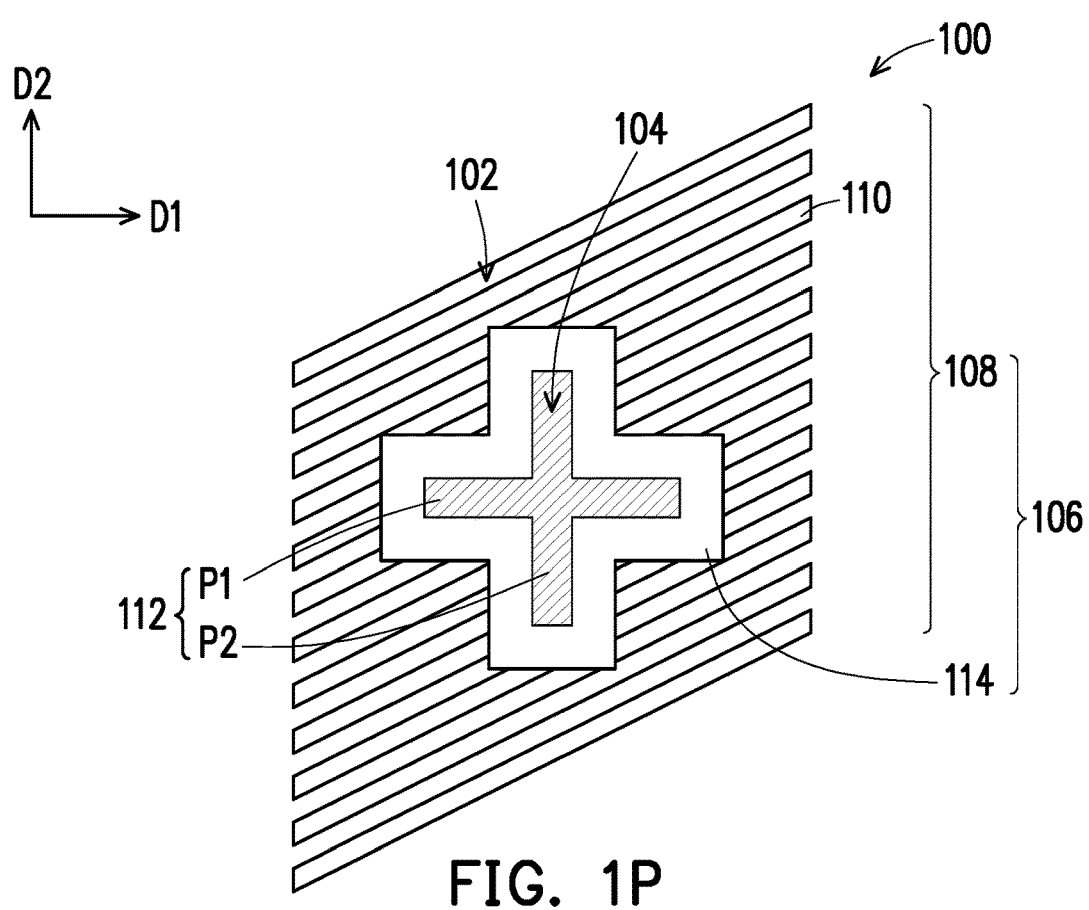
Figure 1Q:
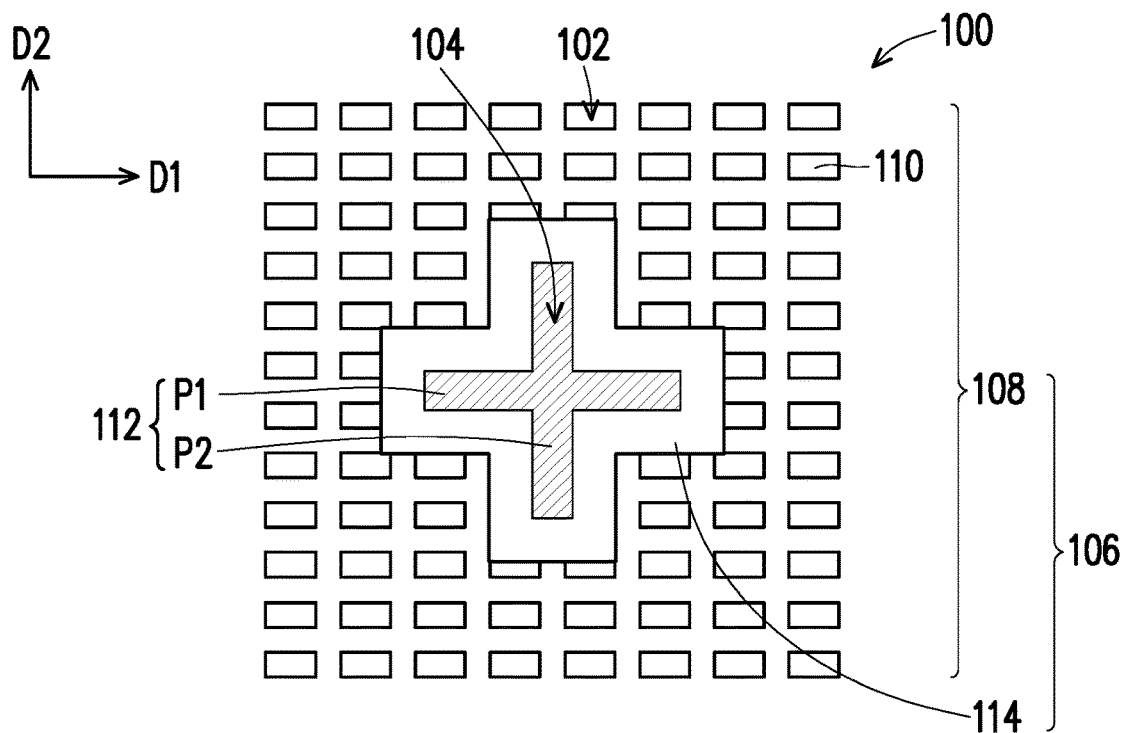
Figure 1R:
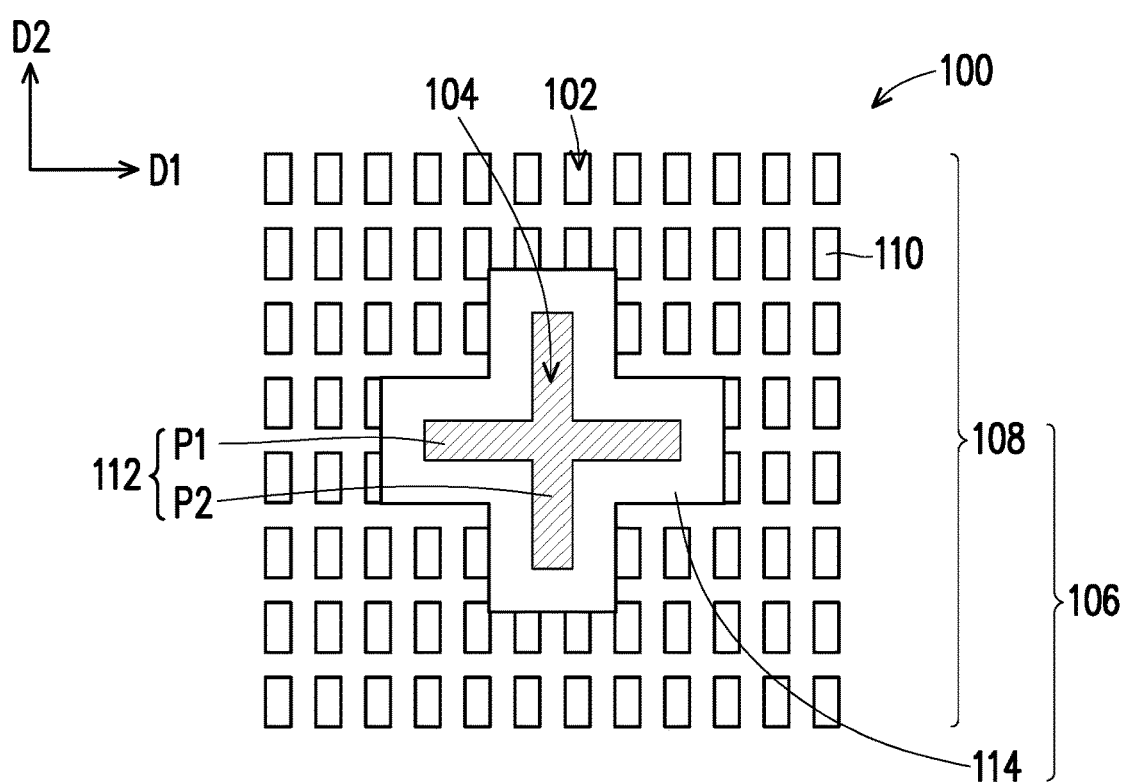
Figure 1S:
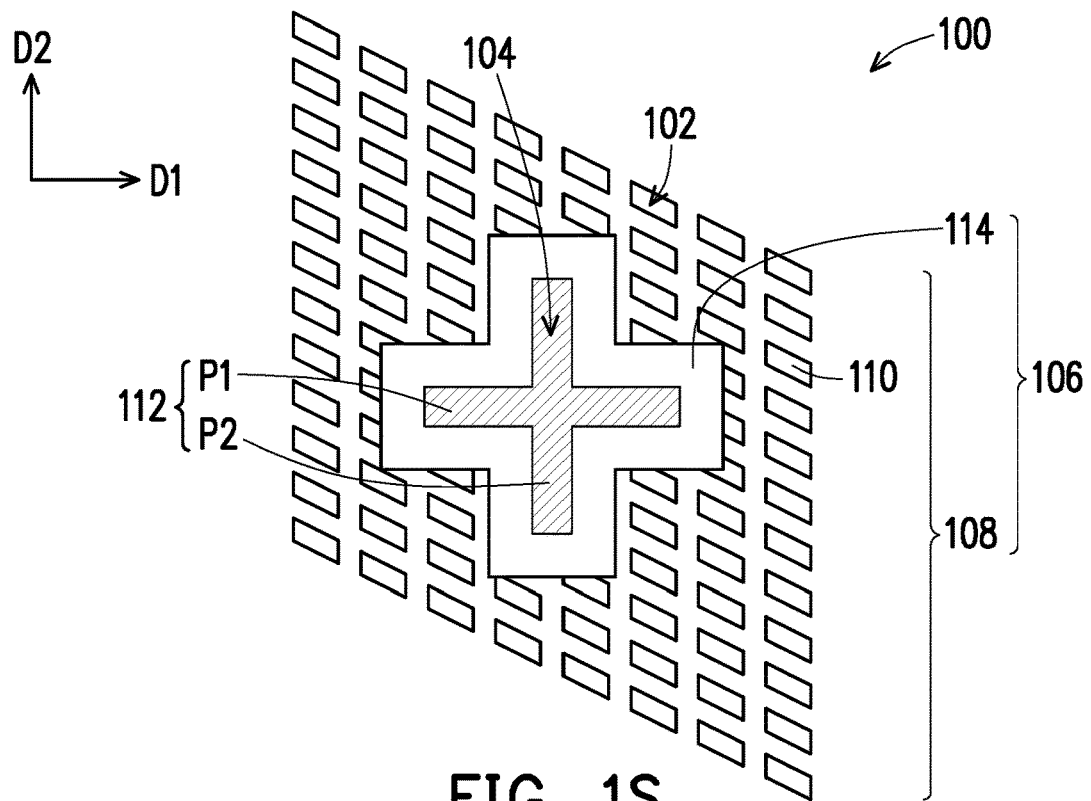
Figure 1T:
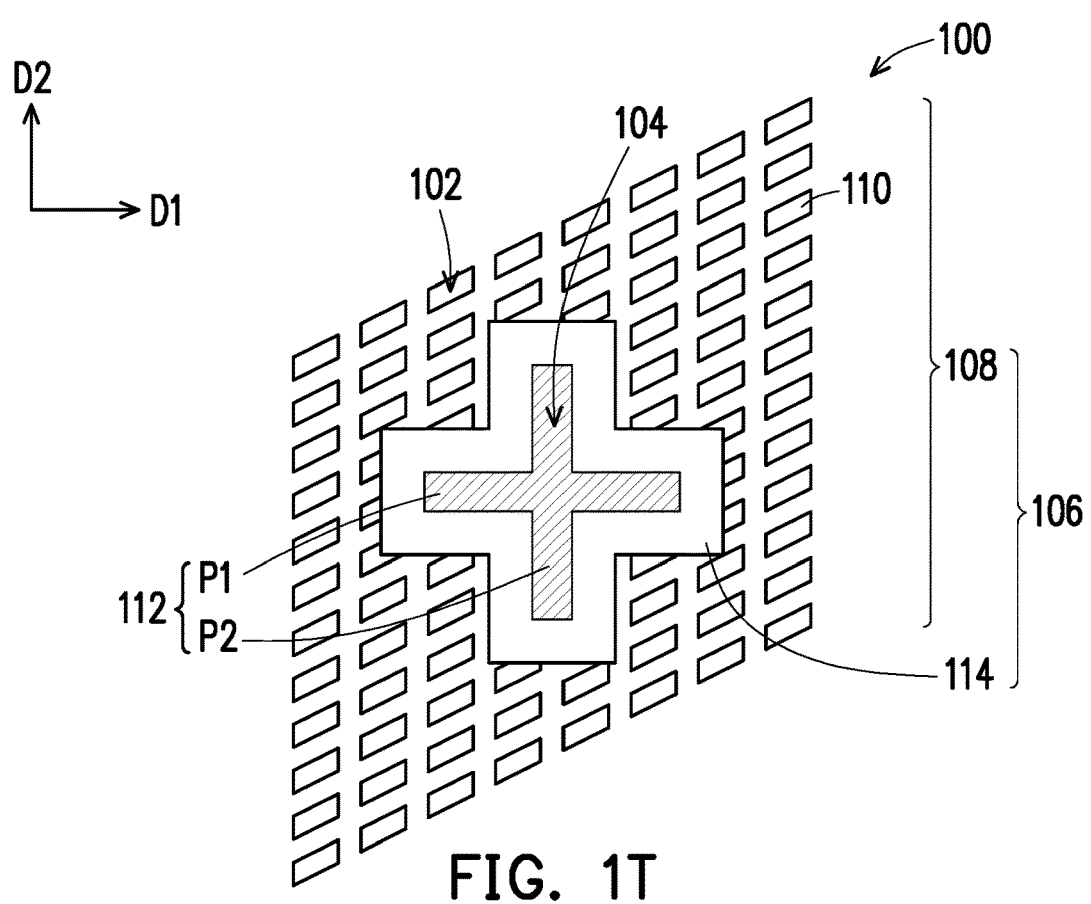
Figure 1U:
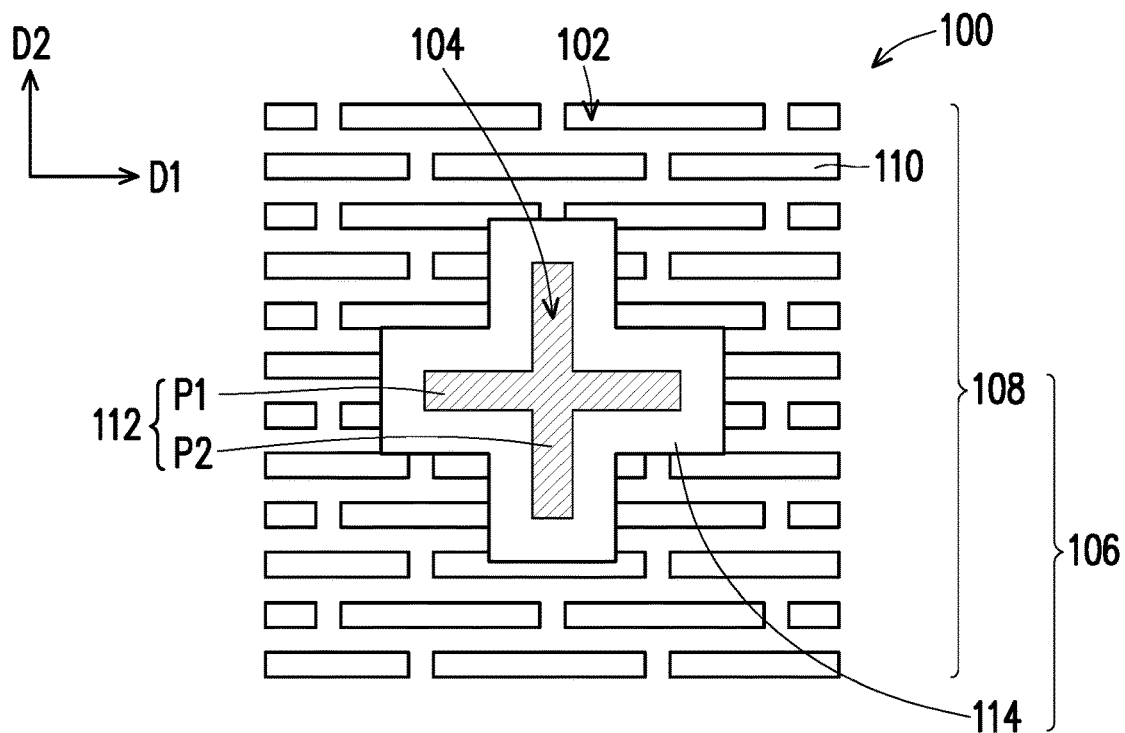
Figure 1V:
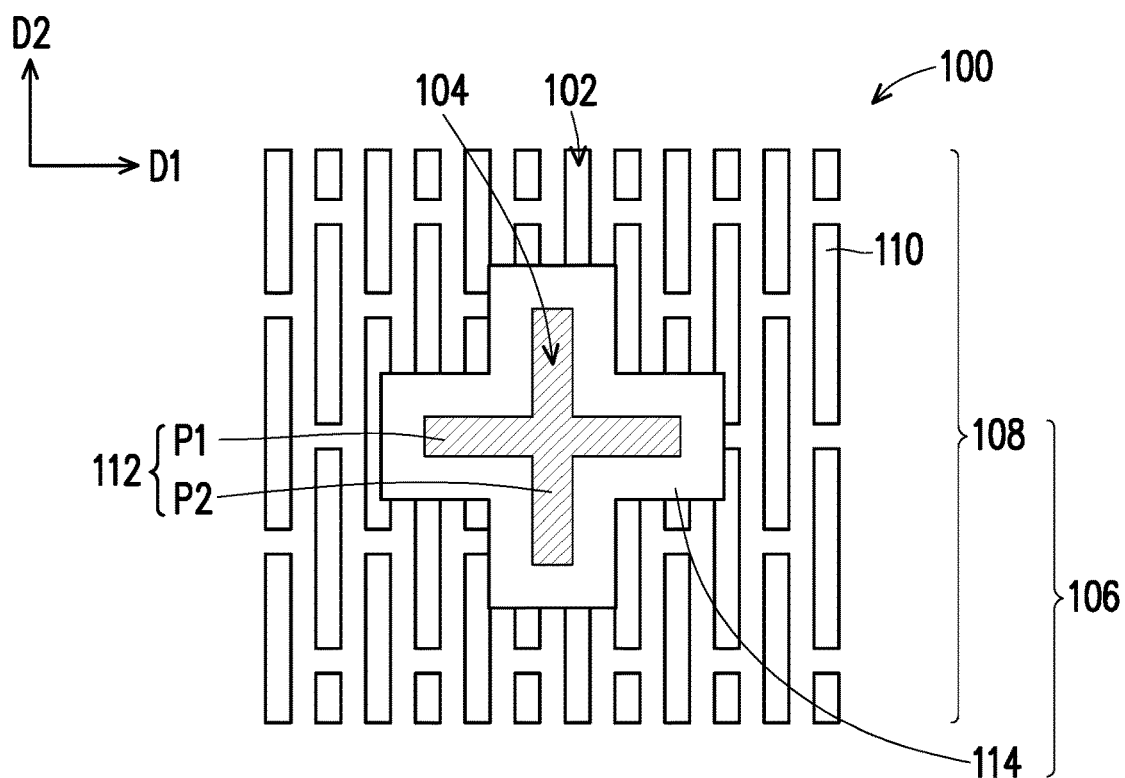
Figure 1W:
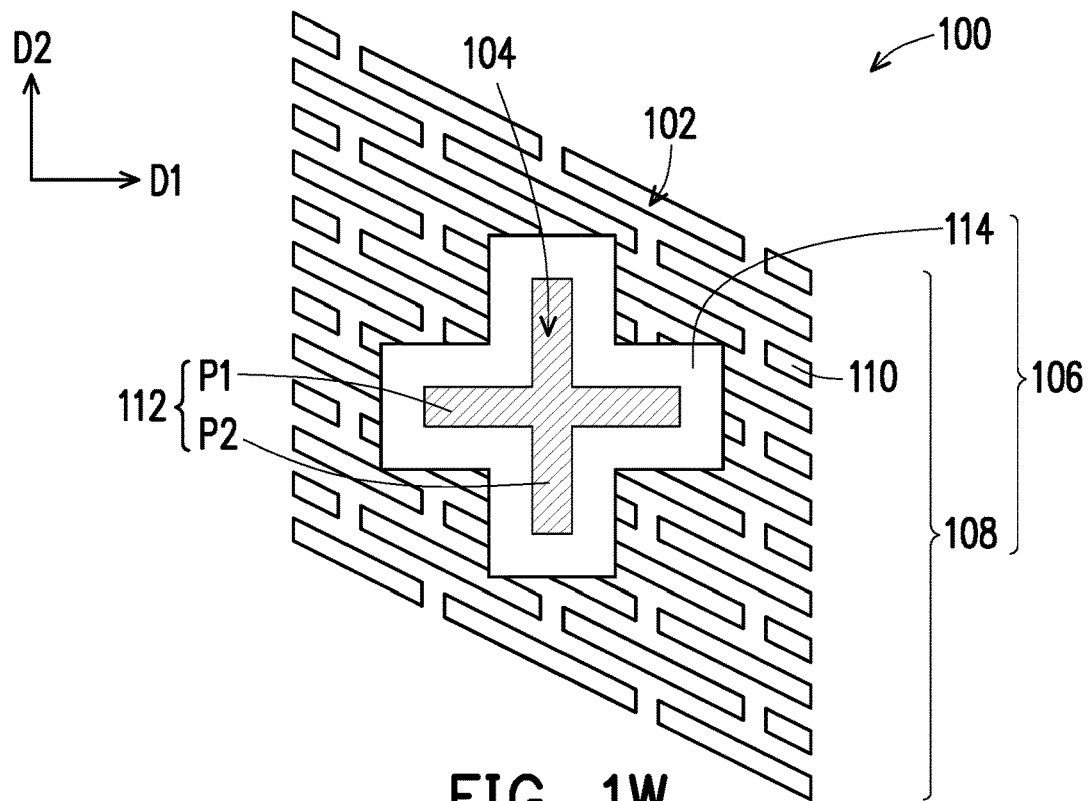
Figure 1X:
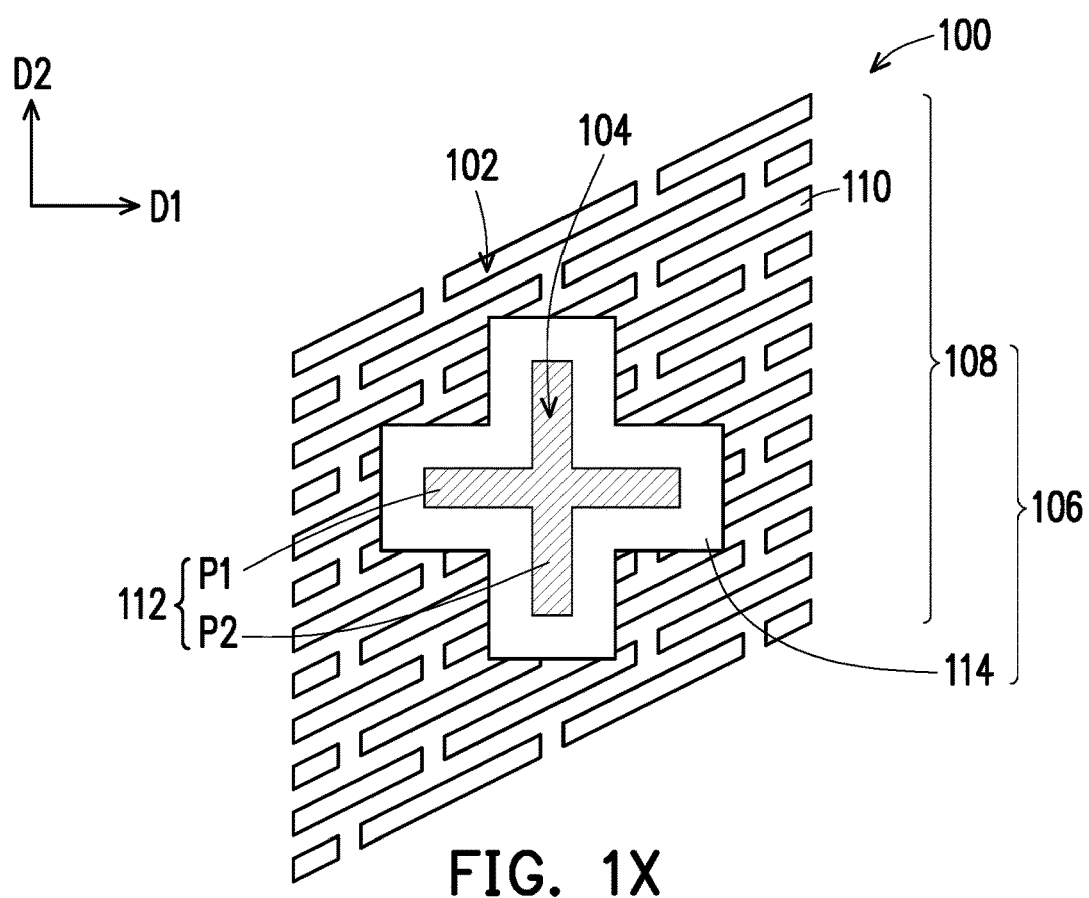
Figure 2:
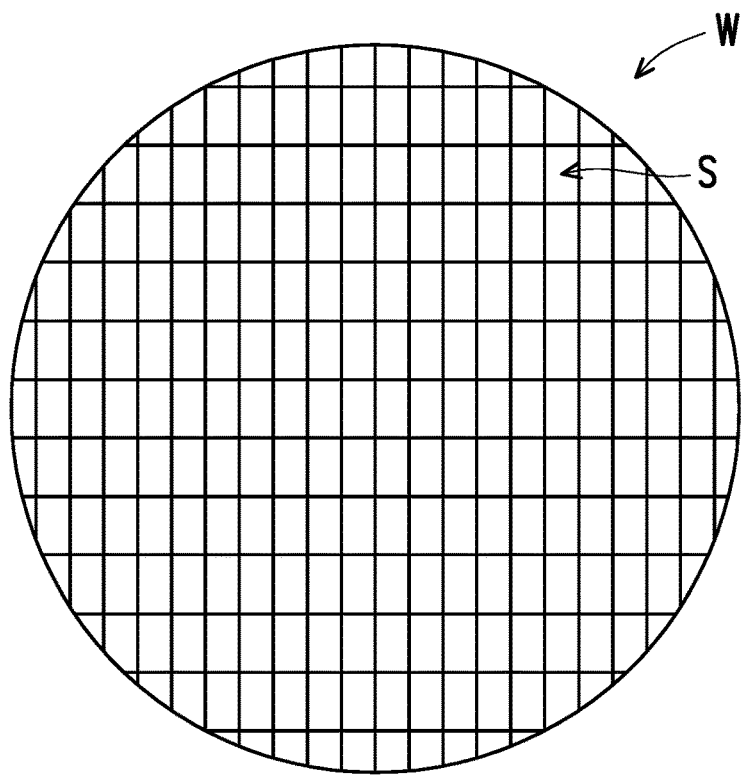
FIG. 2 is an exposure shop map of a wafer according to an embodiment of the invention.
Figure 3:
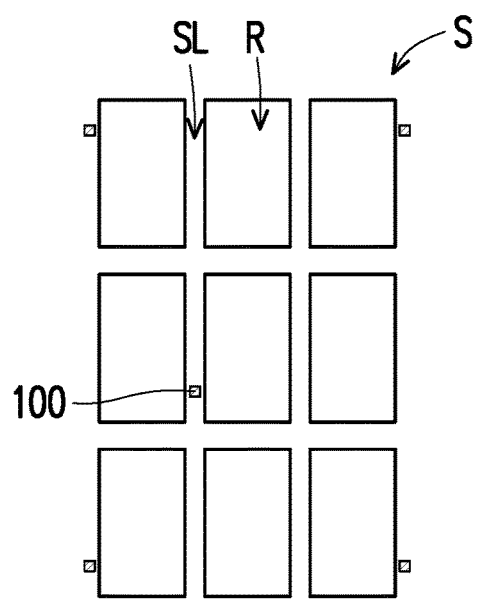
FIG. 3 is a magnified view of exposing regions in FIG. 2.

FIG. 1A to FIG. 1X are schematic views of a monitoring structure for a critical dimension of a lithography process according to some embodiments of the invention. FIG. 2 is an exposure shop map of a wafer according to an embodiment of the invention. FIG. 3 is a magnified view of exposing regions in FIG. 2.

Referring to FIG. 1A to FIG. 1X, a monitoring structure 100 for a critical dimension of a lithography process includes a dummy pattern layer 102 and a patterned photoresist layer 104. Referring to FIG. 2 and FIG. 3, a wafer W may be divided to obtain a plurality of exposing regions S. Each of the exposing regions S may include nine chip regions R, but the invention is not limited thereto. As long as the exposing region S includes at least one chip region R, it belongs to the coverage of the invention. The wafer W may include scribe lanes SL. A scribe lane SL may separate adjacent chip regions R. The monitoring structure 100 may be located above a scribe lane SL of the wafer W.

Referring to FIG. 1A to FIG. 1L, the dummy pattern layer 102 includes a dummy pattern 106. The dummy pattern 106 may include an array-like pattern 108. The array-like pattern 108 may include a plurality of unit patterns 110. The dummy pattern 106 may be a physical portion of the dummy pattern layer 102 or an opening in the dummy pattern layer 102. In the present embodiment, the dummy pattern 106 which is the physical portion of the dummy pattern layer 102 is taken as an example for description. Namely, in the dummy pattern layer 102, the portion other than the dummy pattern 106 is the opening in the dummy pattern layer 102, but the invention is not limited thereto. In other embodiments, the dummy pattern 106 may be the opening in the dummy pattern layer 102. Namely, in the dummy pattern layer 102, the portion other than the dummy pattern 106 may be the physical portion of the dummy pattern layer 102. A material of the dummy pattern layer 102 may include a conductor material (e.g., a metal), a semiconductor material (e.g., poly-silicon) or a dielectric material (e.g., silicon oxide or silicon nitride).

In some embodiments, as illustrated in FIG. 1A to FIG. 1H, lengths of the plurality of unit patterns may be the same. In some embodiments, as illustrated in FIG. 1I to FIG. 1L, the plurality of unit patterns 110 may include a part having the same length and a part having different lengths.

In some embodiments, as illustrated in FIGS. 1A, 1E and 1I, the array-like pattern 108 may include a horizontal line array, but the invention is not limited thereto. An extension direction of the plurality of unit patterns 110 in the horizontal line array is parallel to a first direction D1.

In some embodiments, as illustrated in FIGS. 1B, 1F and 1J, the array-like pattern 108 may be a vertical line array, but the invention is not limited thereto. An extension direction of the plurality of unit patterns 110 in the vertical line array is perpendicular to the first direction D1.

In some embodiments, as illustrated in FIG. 1C, FIG. 1D, FIG. 1G FIG. 1H, FIG. 1K and FIG. 1L, the array-like pattern 108 may be a slash line array, but the invention is not limited thereto. An extension direction of the plurality of unit patterns 110 in the slash line array intersects the first direction D1 in a non-orthogonal manner.

Referring to FIG. 1A to FIG. 1L, the patterned photoresist layer 104 includes at least one monitoring mark 112 located above the dummy pattern 106. The patterned photoresist layer 104 and the dummy pattern layer 102 may be directly adjacent to each other or may be separated from each other by other film layers. The at least one monitoring mark 112 may cover a part of the dummy pattern 106. In the present embodiment, the number of the at least one monitoring mark 112 is illustrated as one for example, but the invention is not limited thereto. As long as the number of the monitoring mark 112 is at least one, it belongs to the coverage of the invention.

The monitoring mark 112 includes a first portion P1 and a second portion P2 that intersect each other. The first portion P1 extends in the first direction D1, the second portion P2 extends in a second direction D2, and the first direction D1 intersects the second direction D2. A width of the first portion P1 and a width of the second portion P2 are, for example, greater than a width of each of the unit patterns 110. For example, the first direction D1 and the second direction D2 may be perpendicular to each other. In the present embodiment, a shape of the monitoring mark 112 is, for example, a cross-like shape, but the invention is not limited thereto. In some embodiments, the monitoring mark 112 may further include other portions (not shown) in addition to the first portion P1 and the second portion P2. As long as at least a part of the shape of the monitoring mark 112 includes a shape composed of the first portion P1 and the second portion P2, it belongs to the coverage of the invention.

The monitoring mark 112 may be a physical portion of the patterned photoresist layer 104 or an opening in the patterned photoresist layer 104. In the present embodiment, the monitoring mark 112 which is the physical portion of the patterned photoresist layer 104 is taken as an example for description. Namely, in the patterned photoresist layer 104, the portion other than the monitoring mark 112 is the opening in the patterned photoresist layer 104, but the invention is not limited thereto. In other embodiments, the monitoring mark 112 may be the opening in the patterned photoresist layer 104. Namely, in the patterned photoresist layer 104, the portion other than the monitoring mark 112 is the physical portion of the patterned photoresist layer 104.

Referring to FIG. 1A to FIG. 1X, the difference between the monitoring structure 100 illustrated in FIG. 1M to FIG. 1X and the monitoring structure 100 illustrated in FIG. 1A to FIG. 1L is as below. In the monitoring structure 100 illustrated in FIG. 1M to FIG. 1X, the dummy pattern 106 further includes a pad pattern 114. A size of the pad pattern 114 may be greater than a size of the monitoring mark 112. The monitoring mark 112 may be located directly above the pad pattern 114, and a projection of the monitoring mark 112 may completely fall on the pad pattern 114, thereby improving a measurement accuracy of the critical dimension for the monitoring mark 112. The pad pattern 114 and the monitoring mark 112 may have the same shape (e.g., a cross-like shape). The pad pattern 114 and a part of the array-like pattern 108 may be connected with each other. In addition, the same elements in the monitoring structure 100 illustrated in FIG. 1M to FIG. 1X and the monitoring structure 100 illustrated in FIG. 1A to FIG. 1L are represented by the same symbols while the descriptions thereof are omitted.

According to the above embodiments, in the monitoring structure 100 for the critical dimension of the lithography process, because the dummy pattern 106 is located under the monitoring mark 112, an environment under the monitoring mark 112 may be similar to that of the chip region R. Thereby, the uniformity of the critical dimension for the monitoring mark 112 above different locations of the wafer W can be effectively improved, and the misjudgment caused by the poor uniformity of the critical dimension for the monitoring mark 112 may be prevented. In this way, the critical dimension of the lithography process can be effectively monitored and controlled, and whether the process capability of a machine (e.g., an exposure apparatus) is varied may be determined.

Figure 4A:
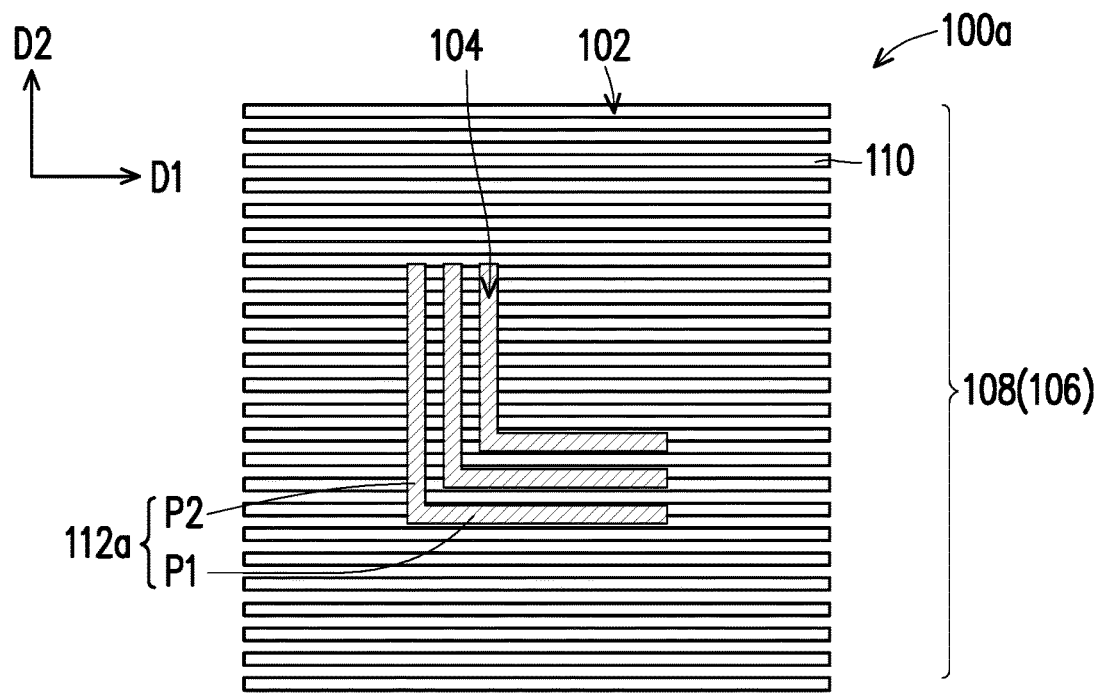
FIG. 4A to FIG. 4X are schematic views of a monitoring structure for a critical dimension of a lithography process according to some other embodiments of the invention.
Figure 4B:
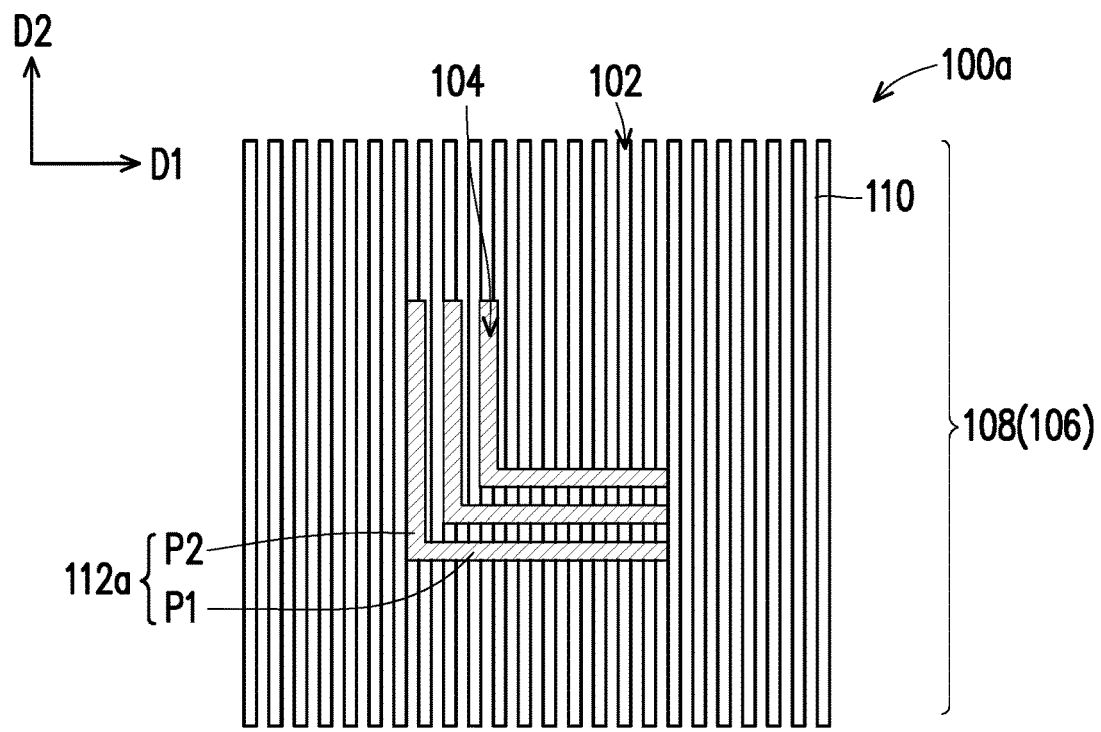
Figure 4C:
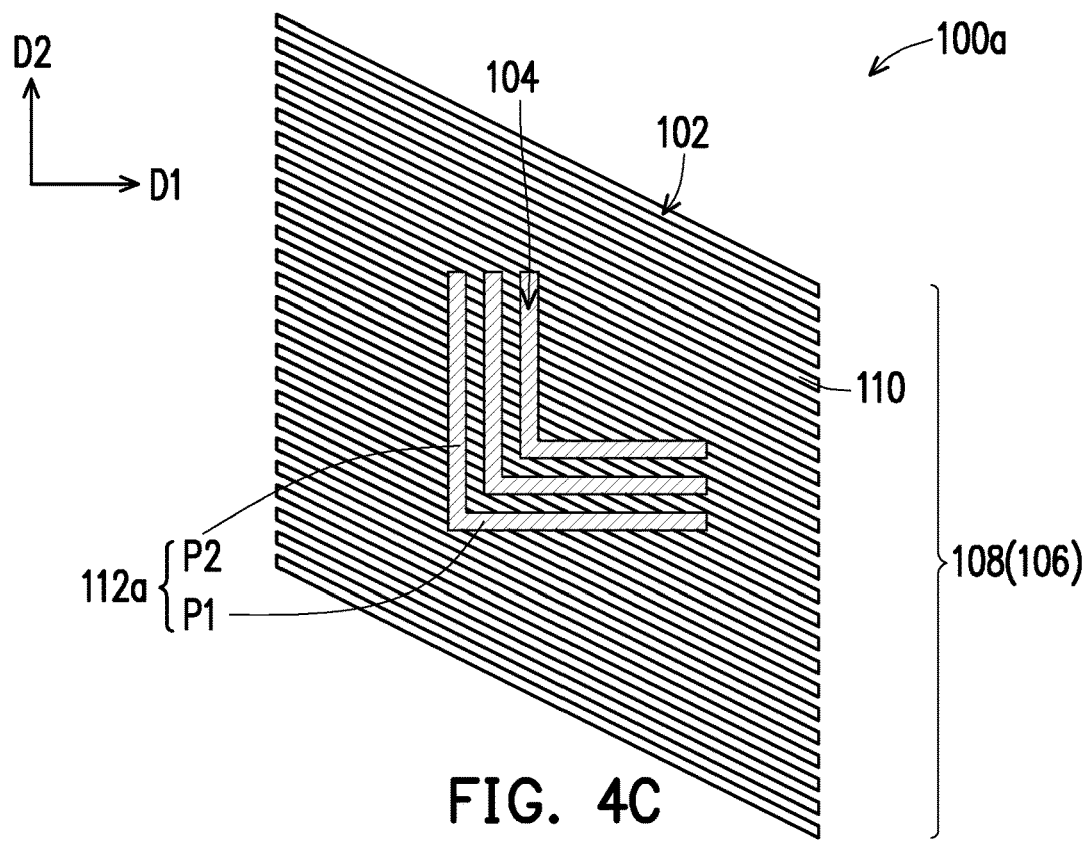
Figure 4D:
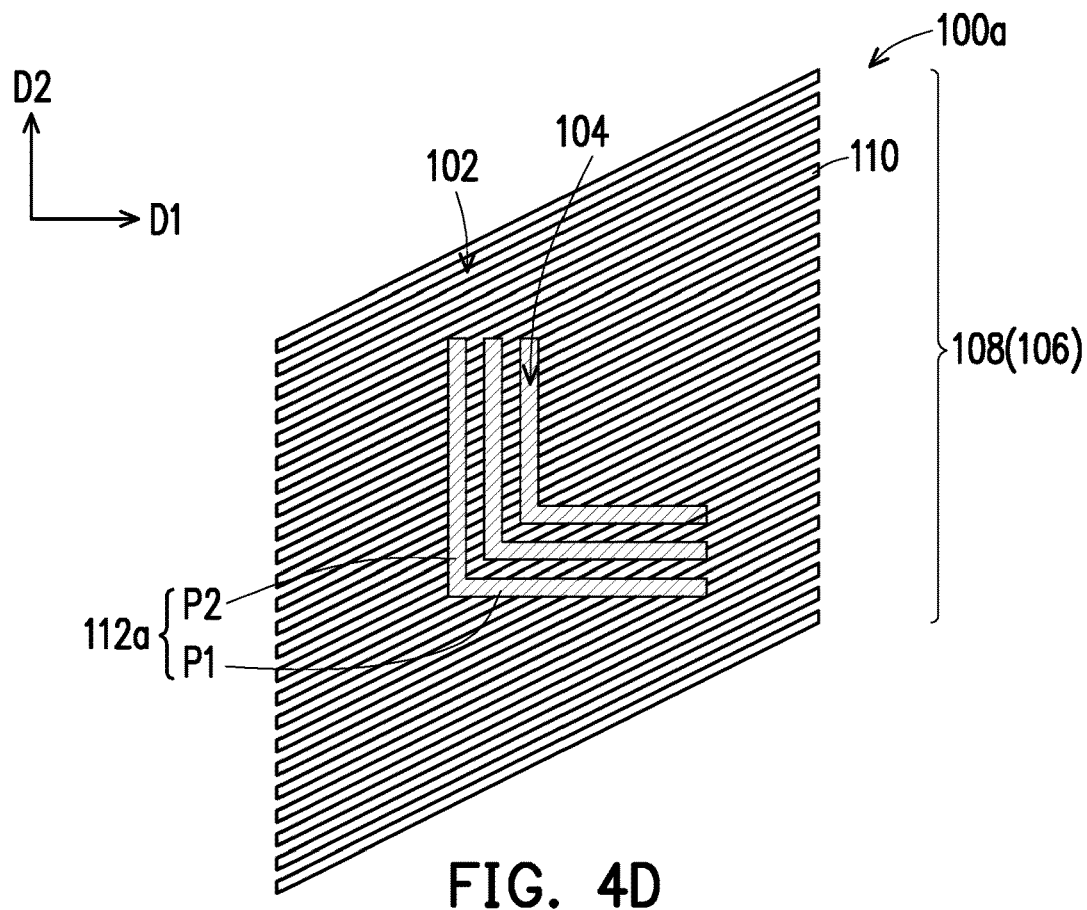
Figure 4E:
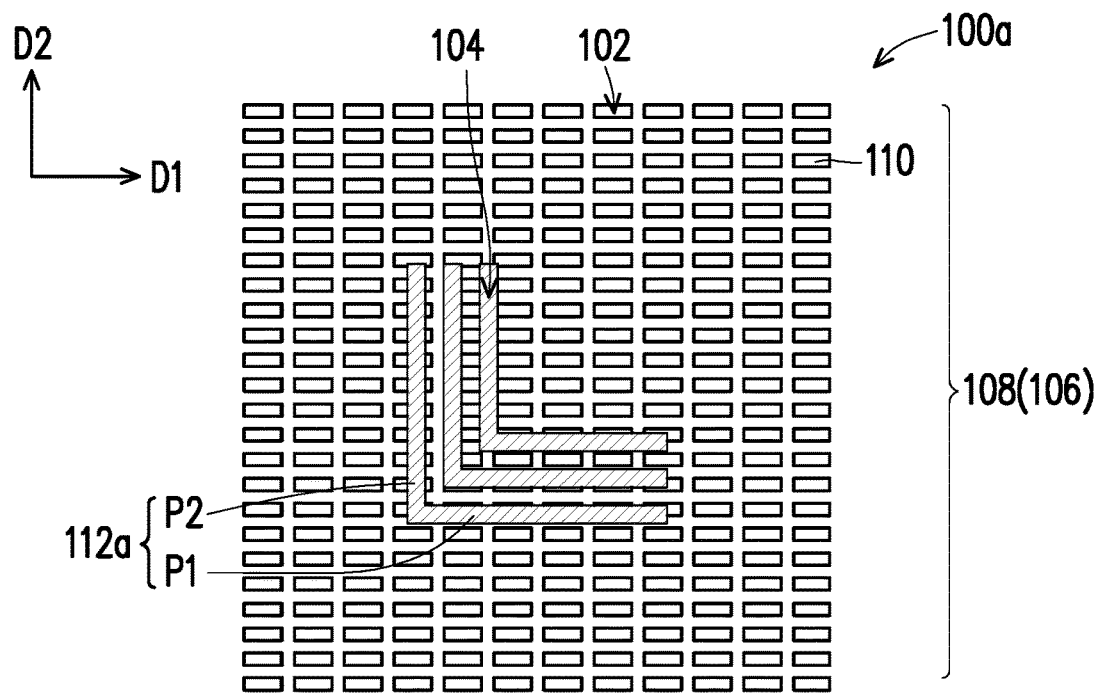
Figure 4F:
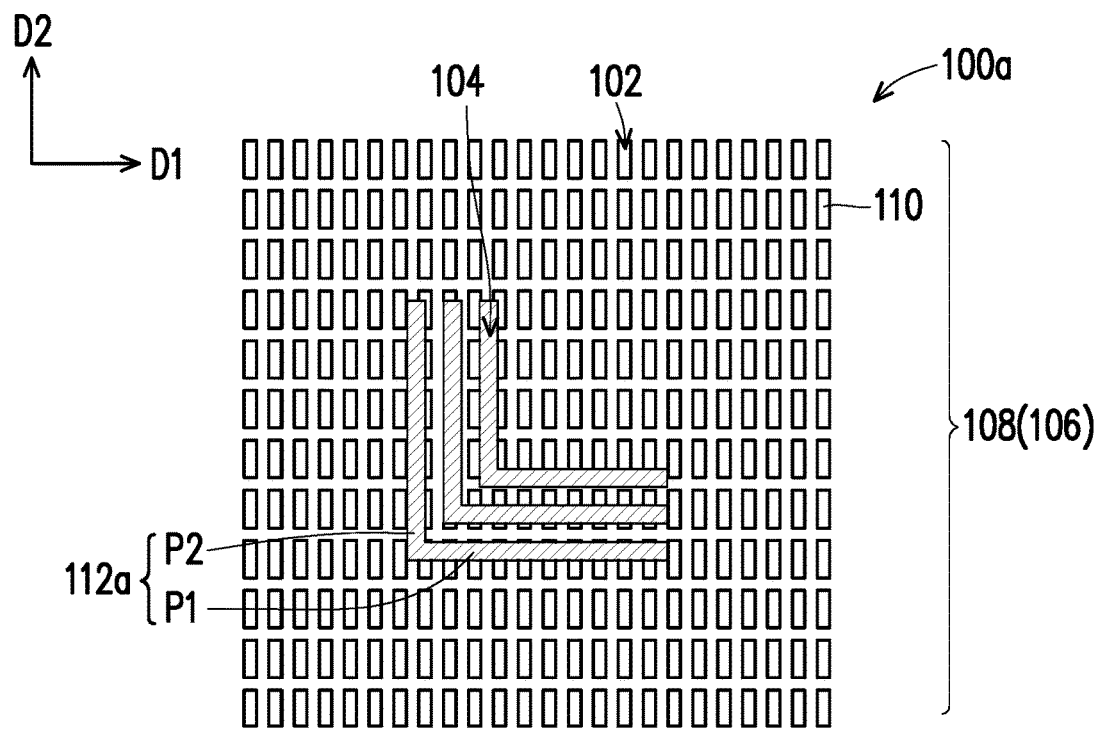
Figure 4G:
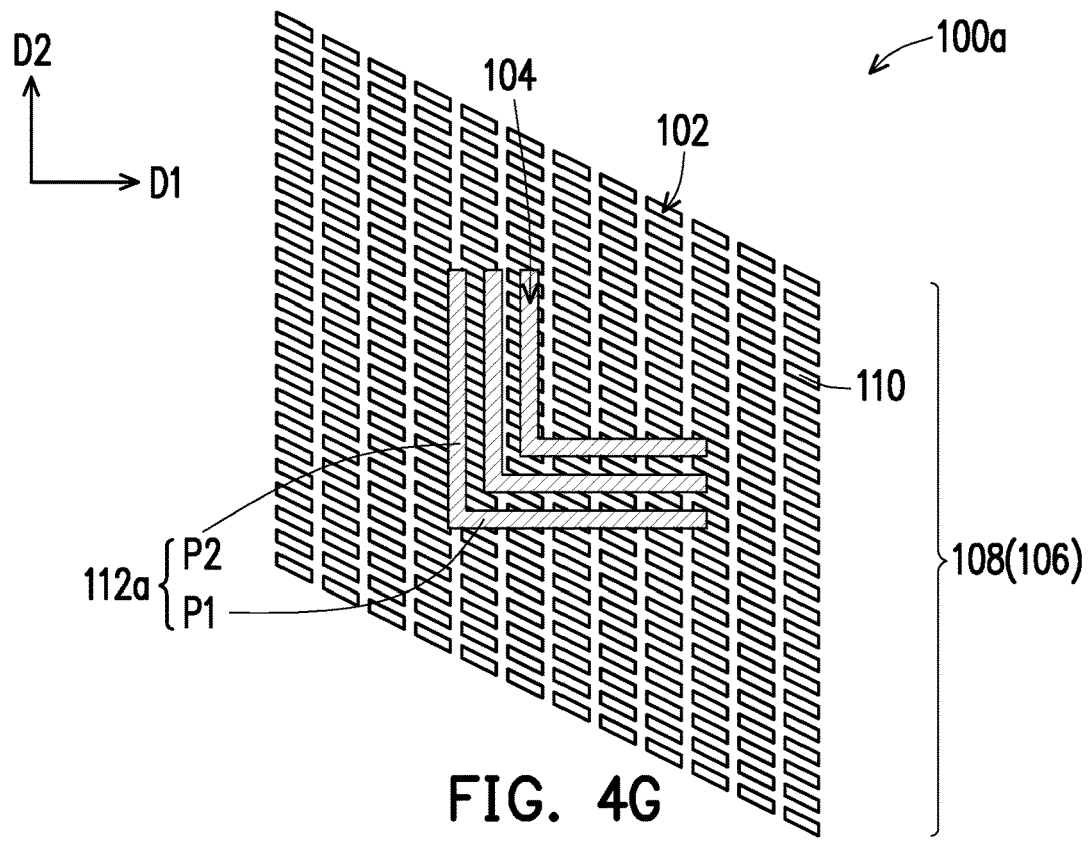
Figure 4H:
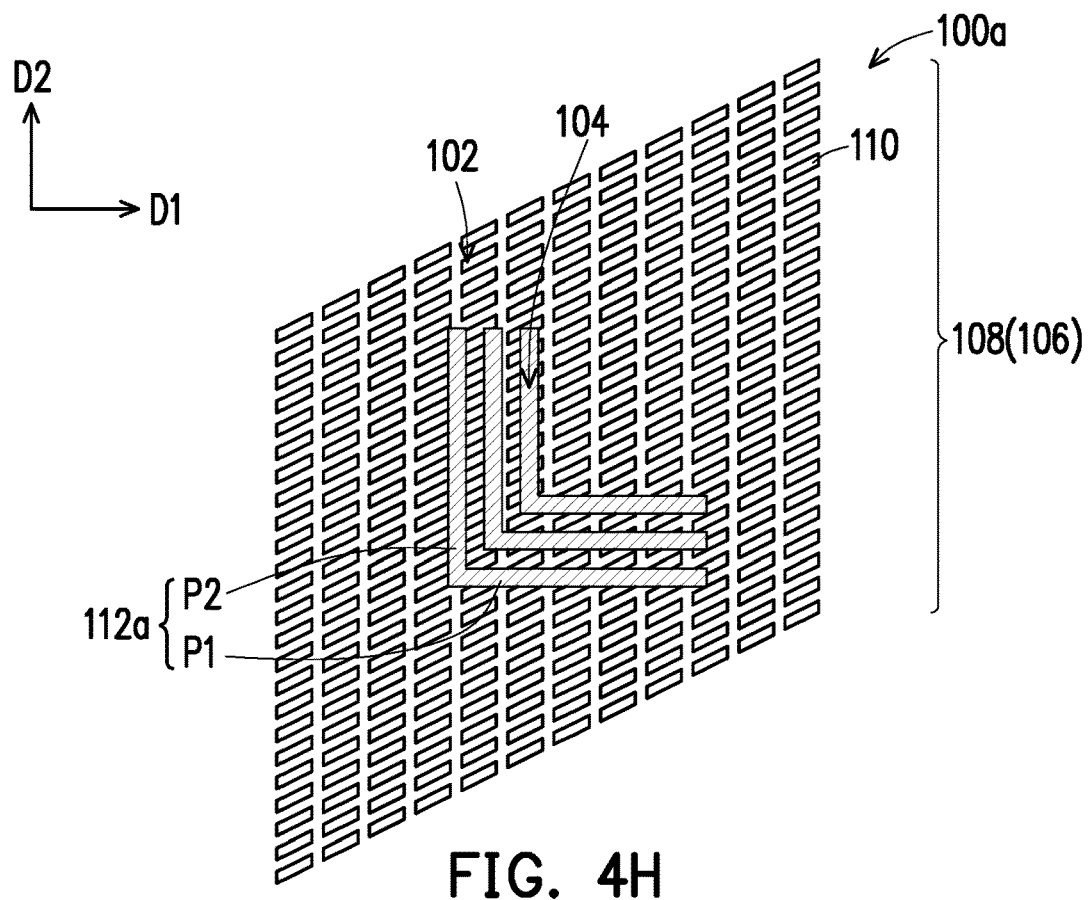
Figure 4I:
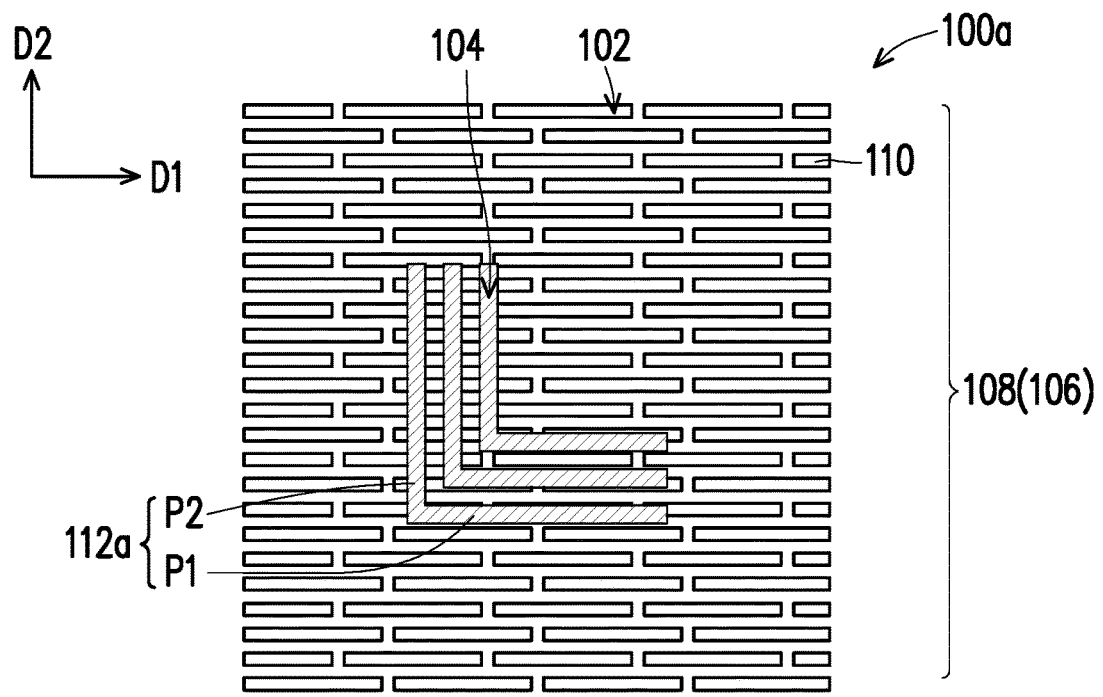
Figure 4J:
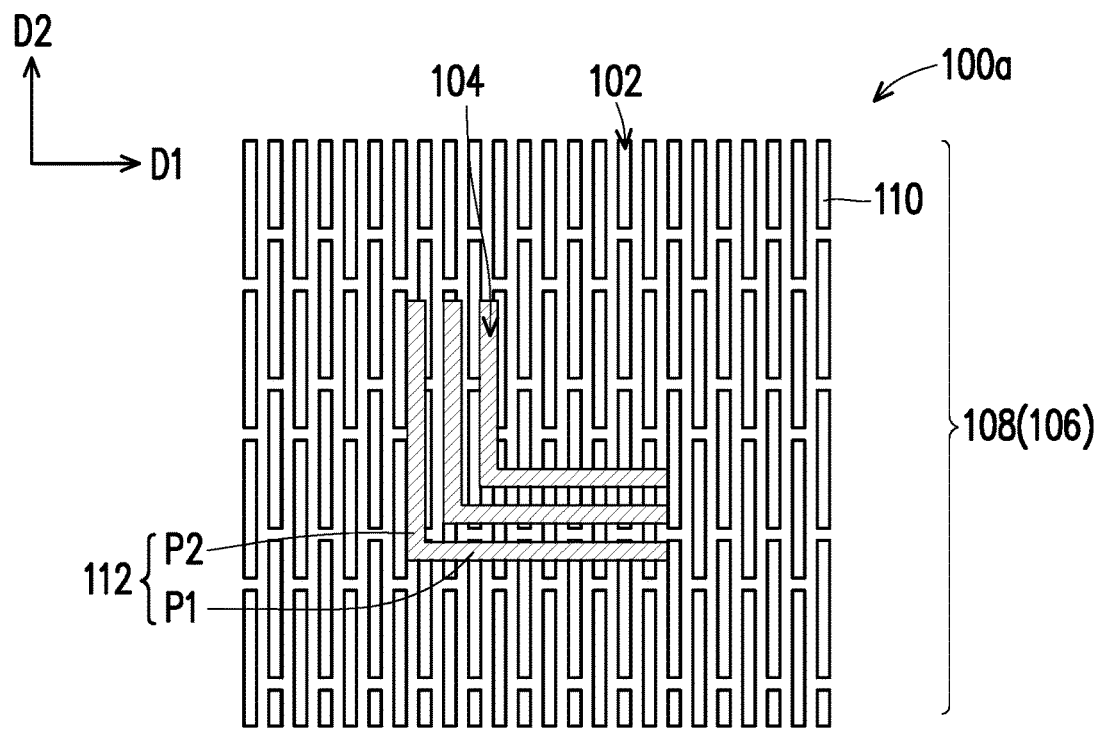
Figure 4K:
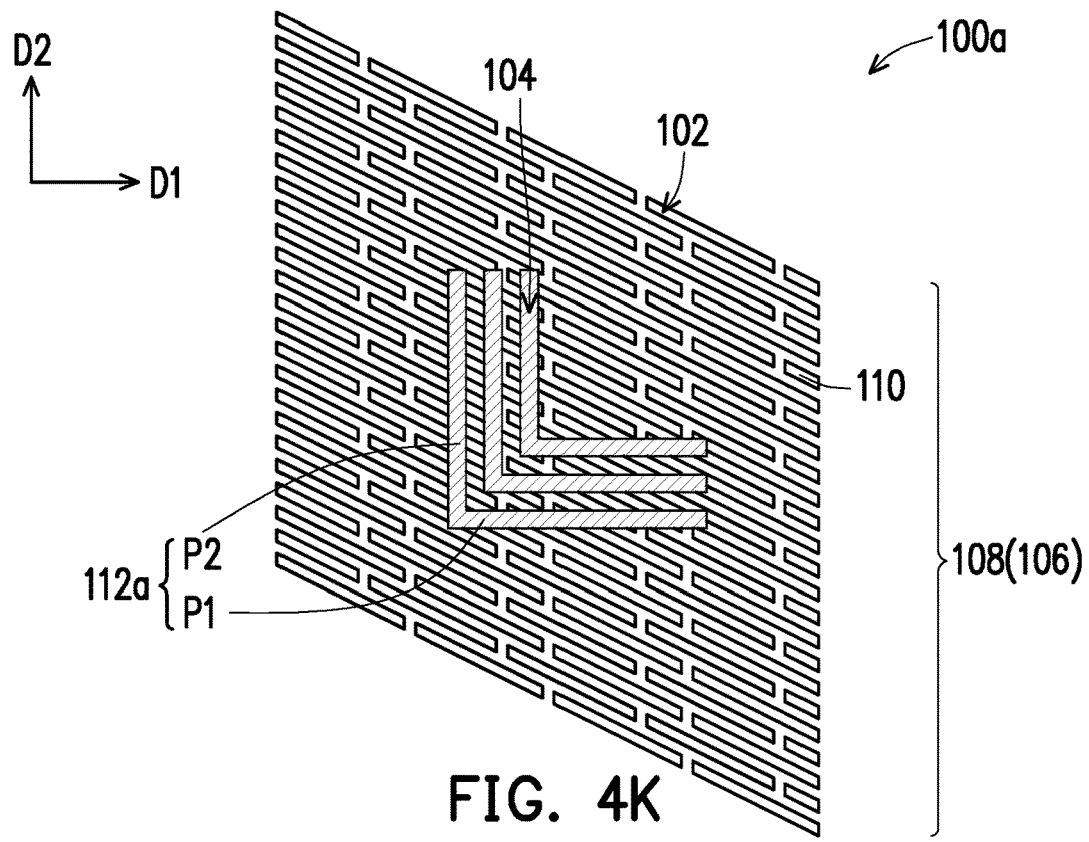
Figure 4L:
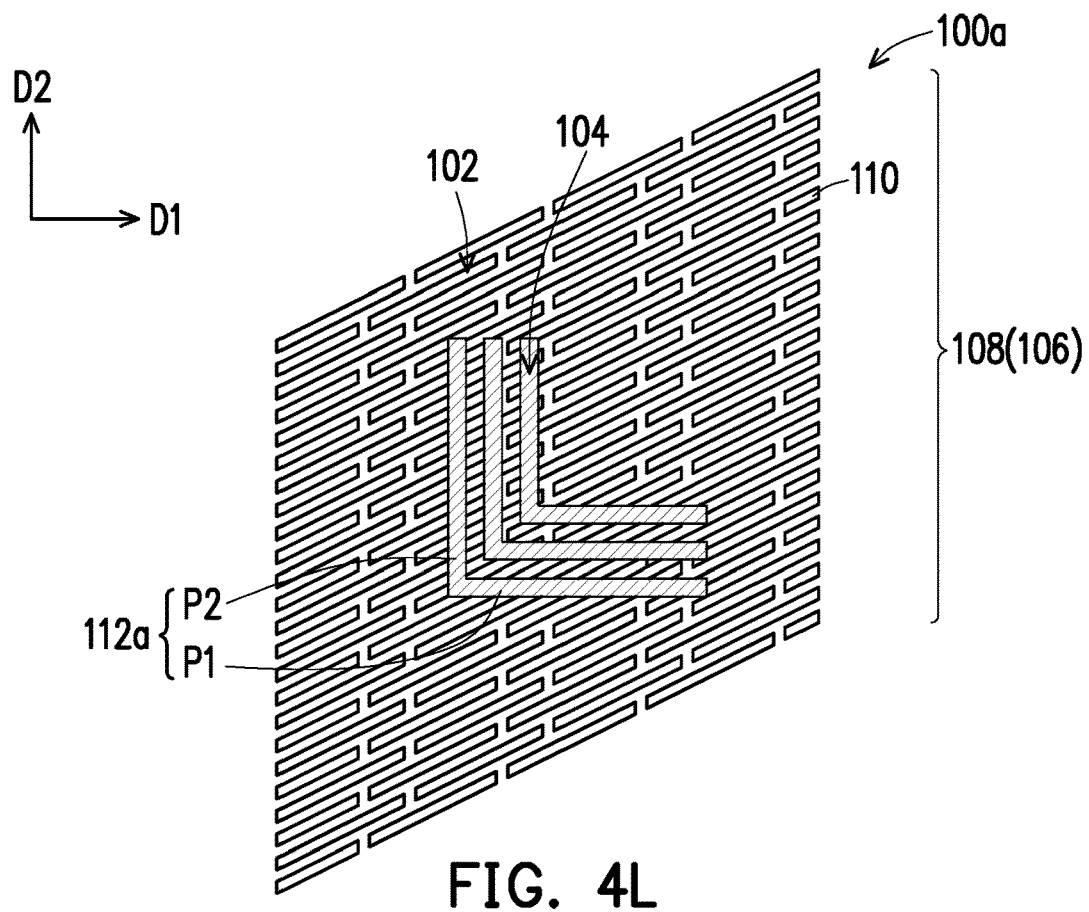
Figure 4M:
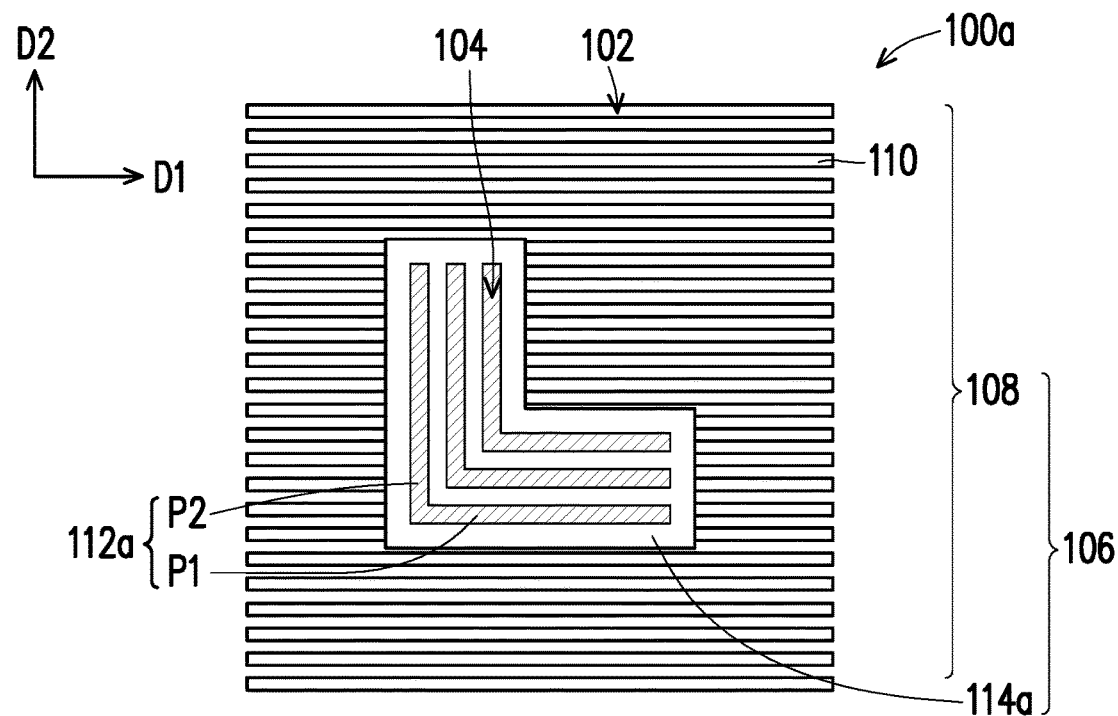
Figure 4N:
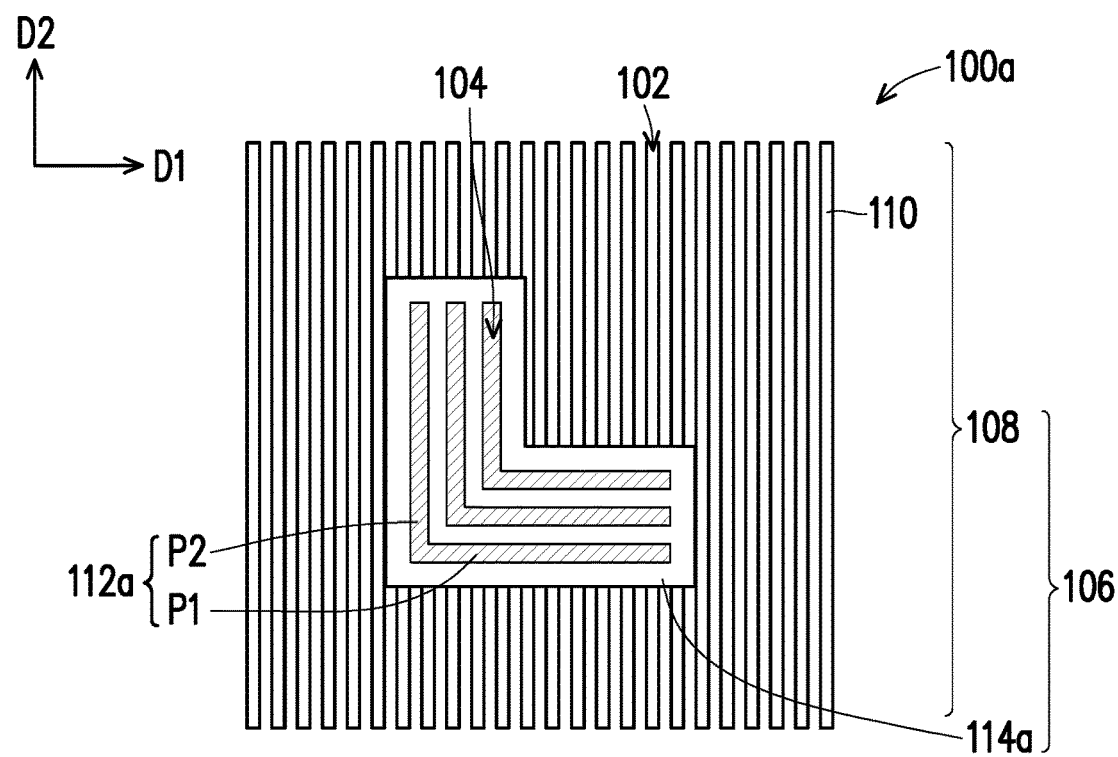
Figure 4O:
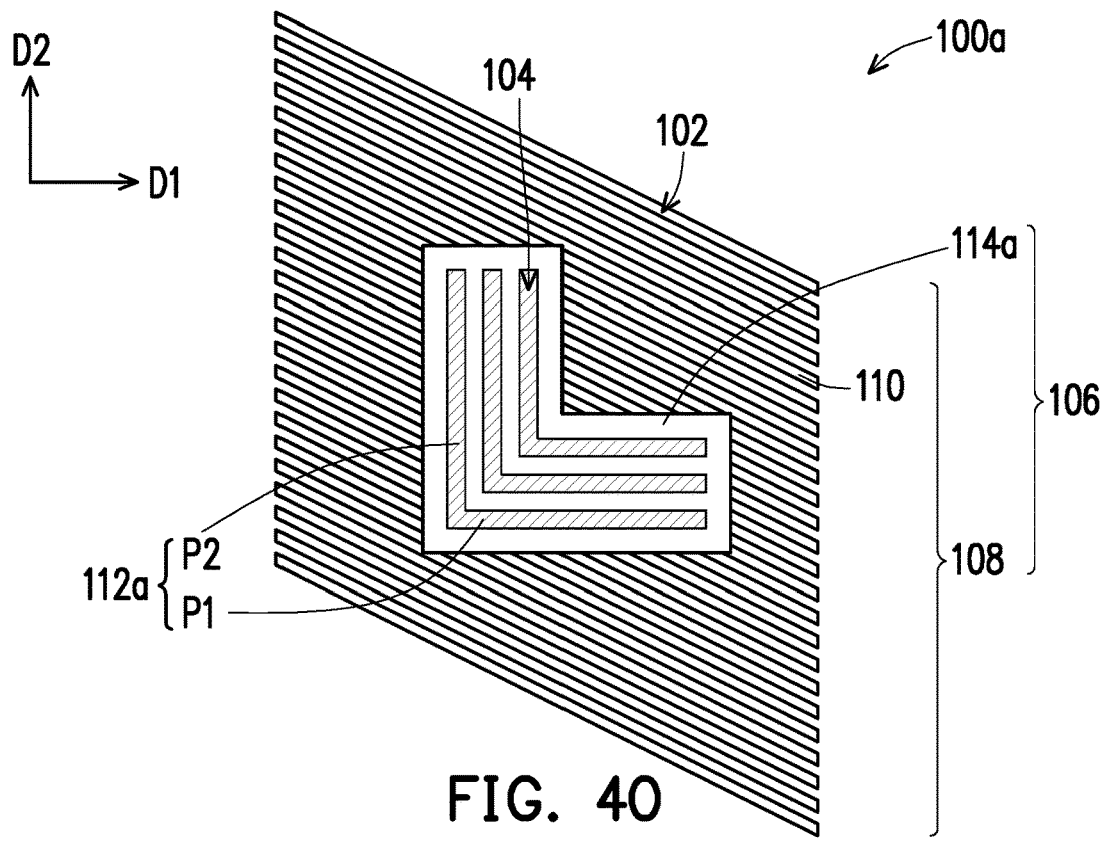
Figure 4P:
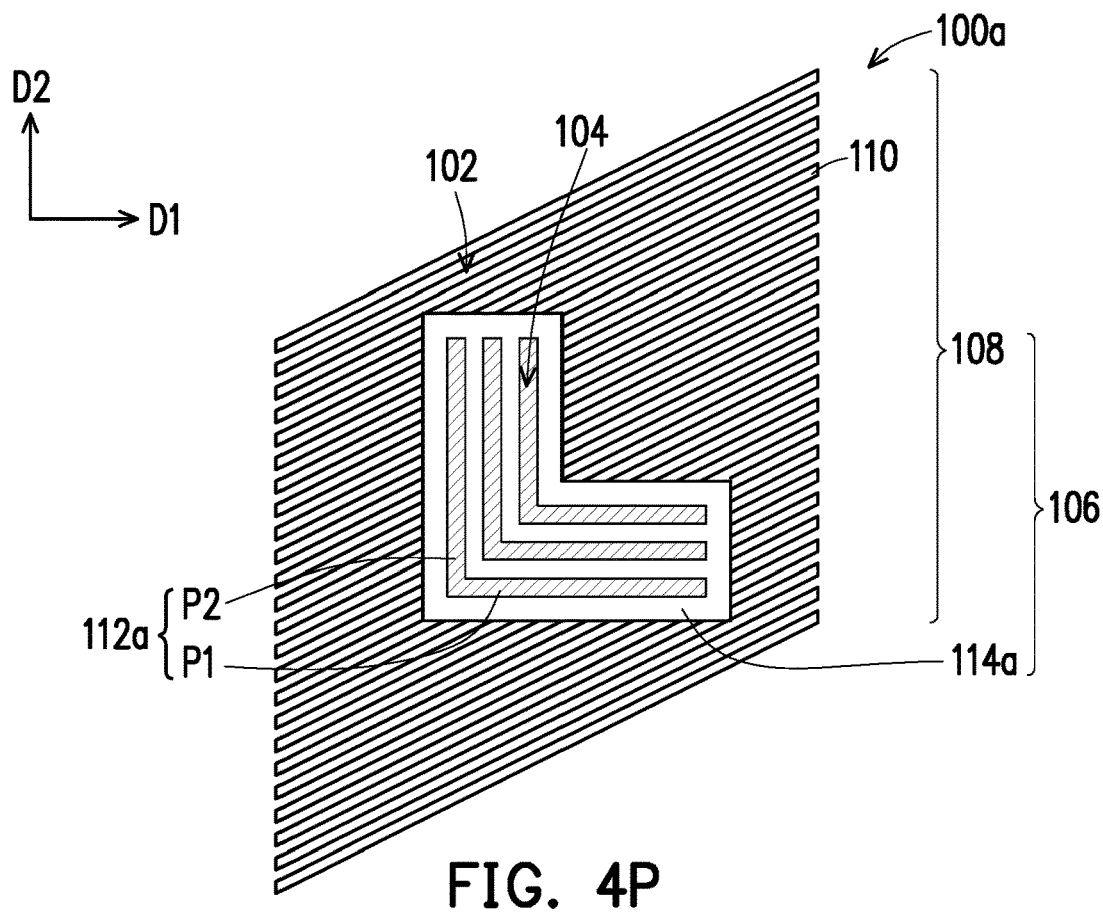
Figure 4Q:
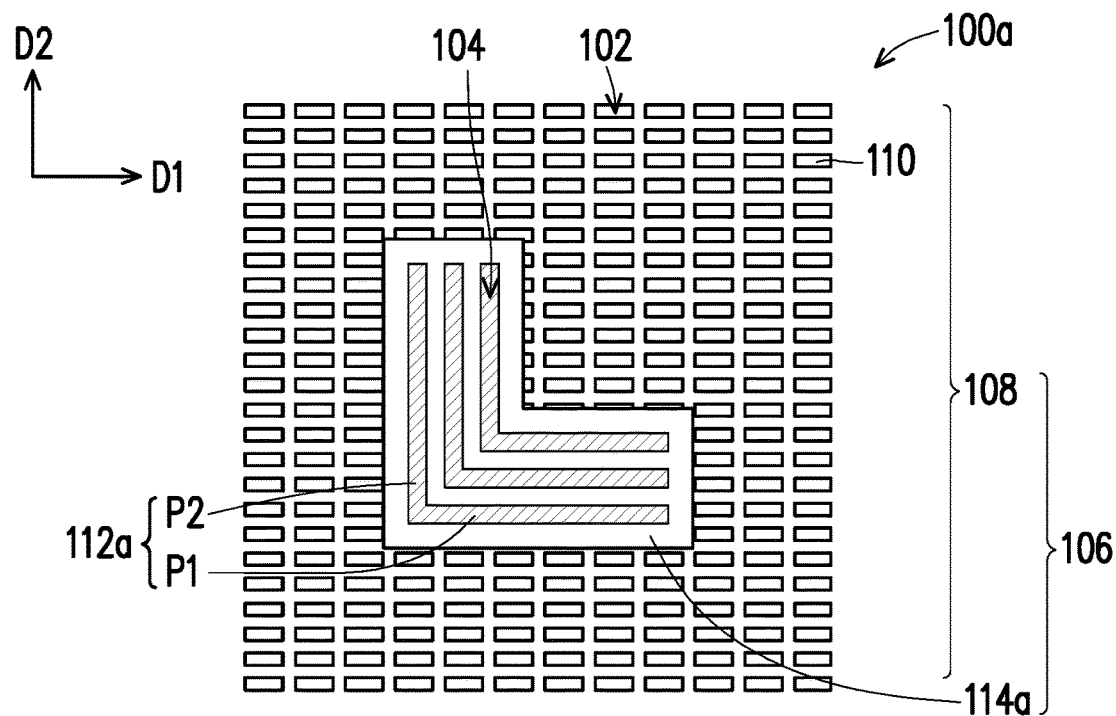
Figure 4R:
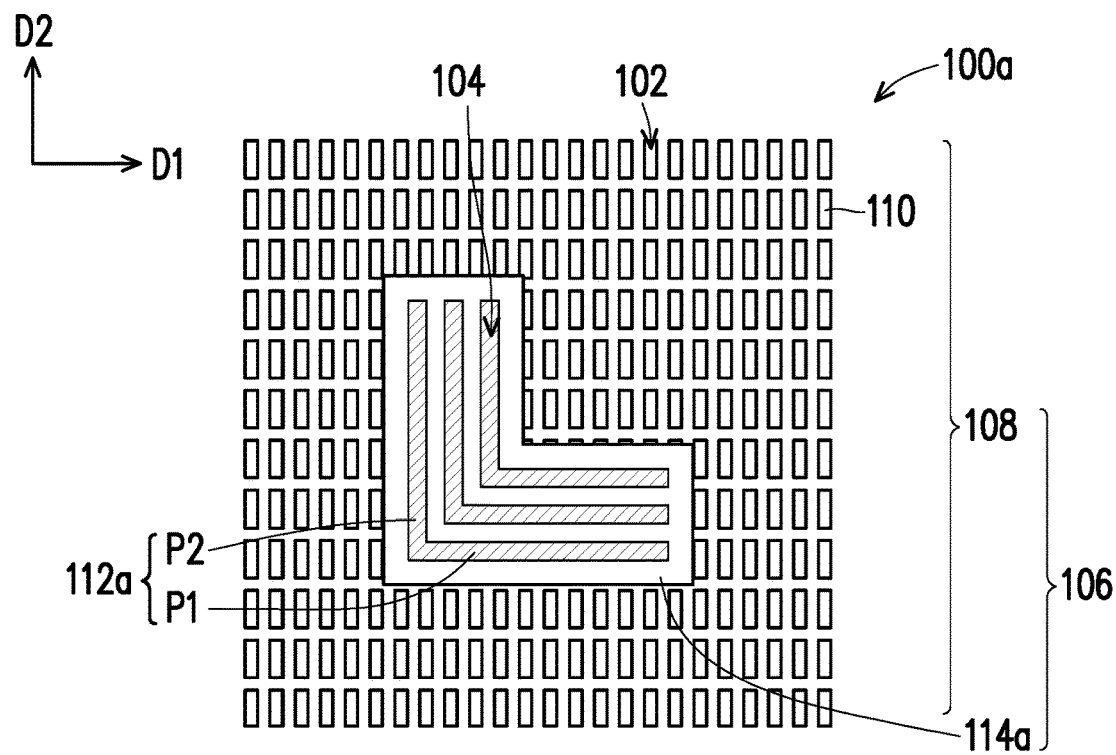
Figure 4S:
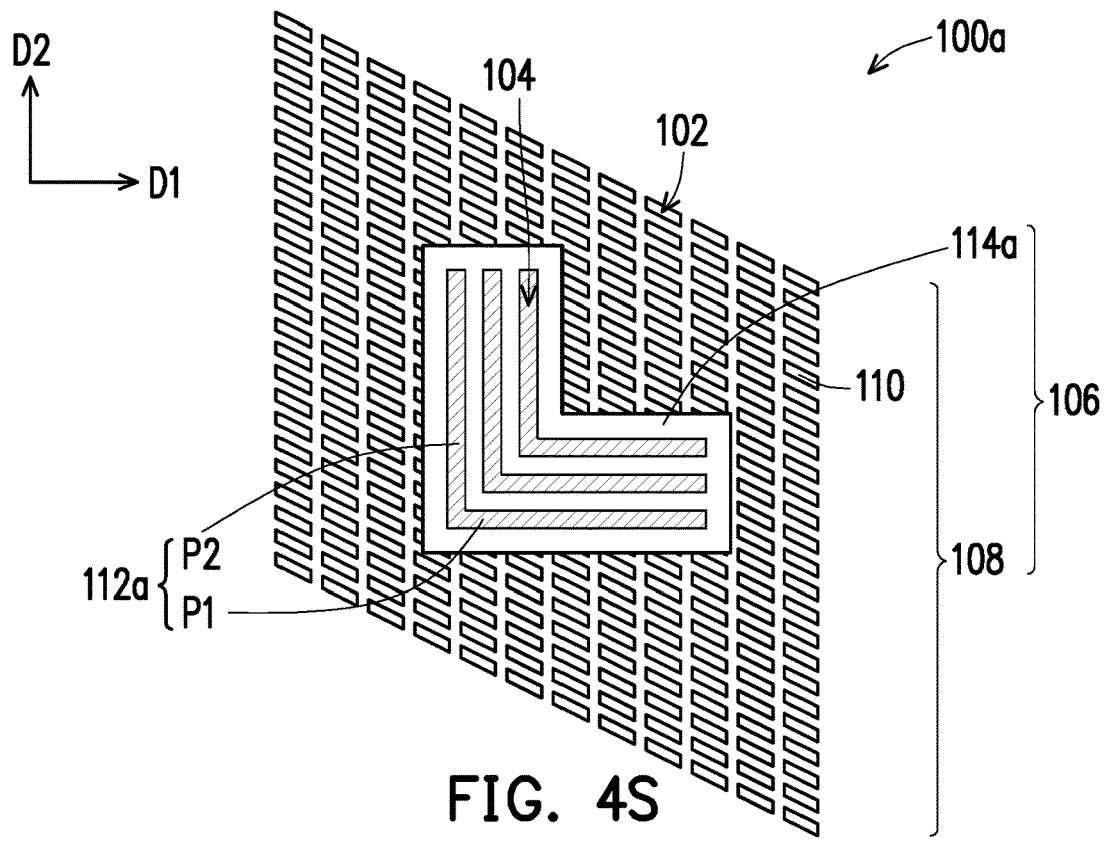
Figure 4T:
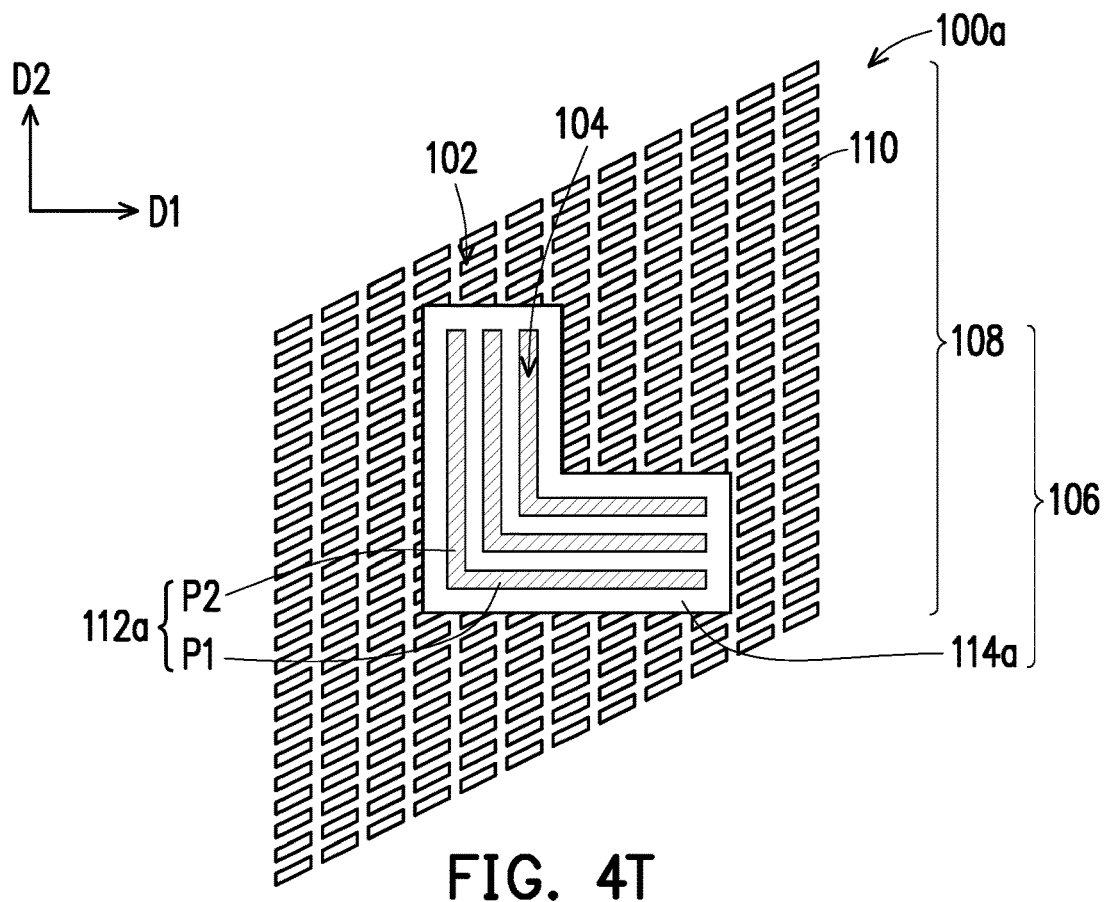
Figure 4U:
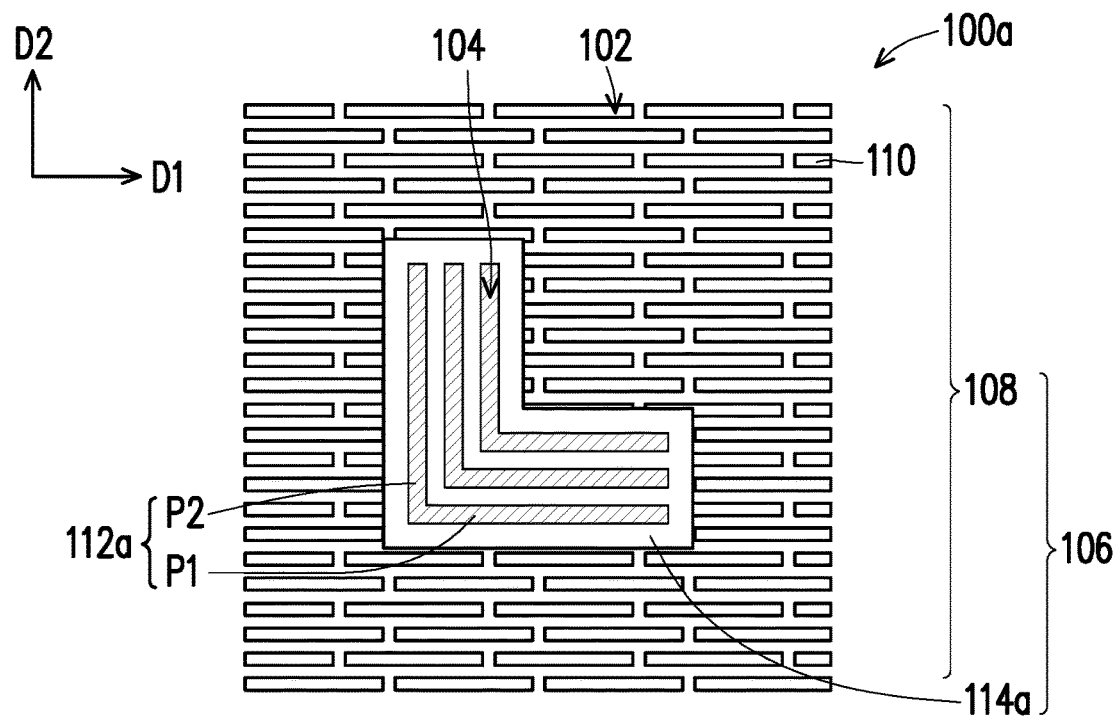
Figure 4V:
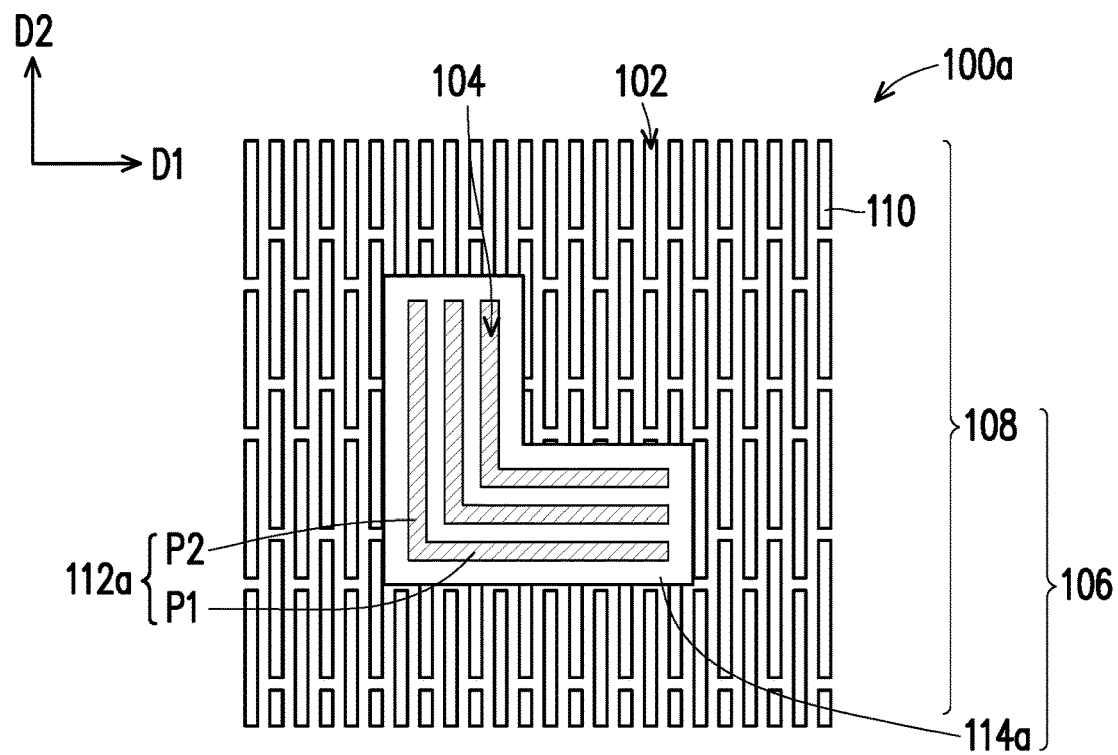
Figure 4W:
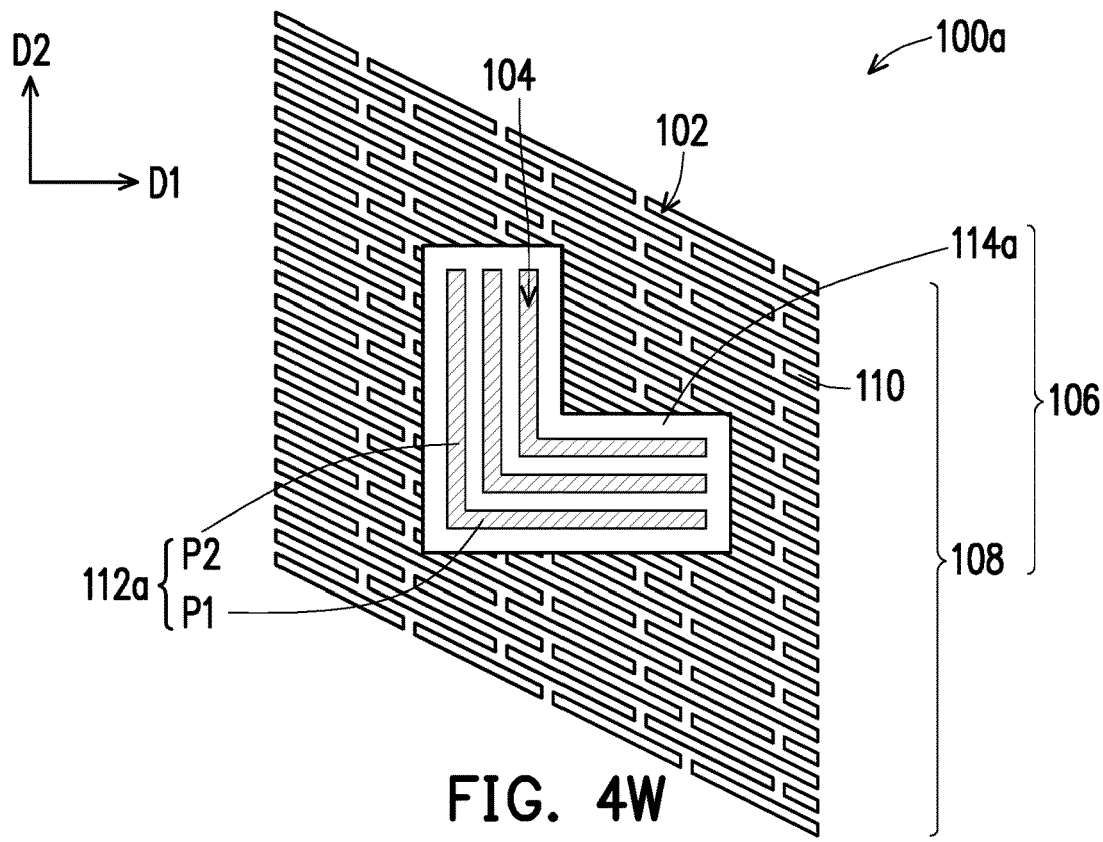
Figure 4X:
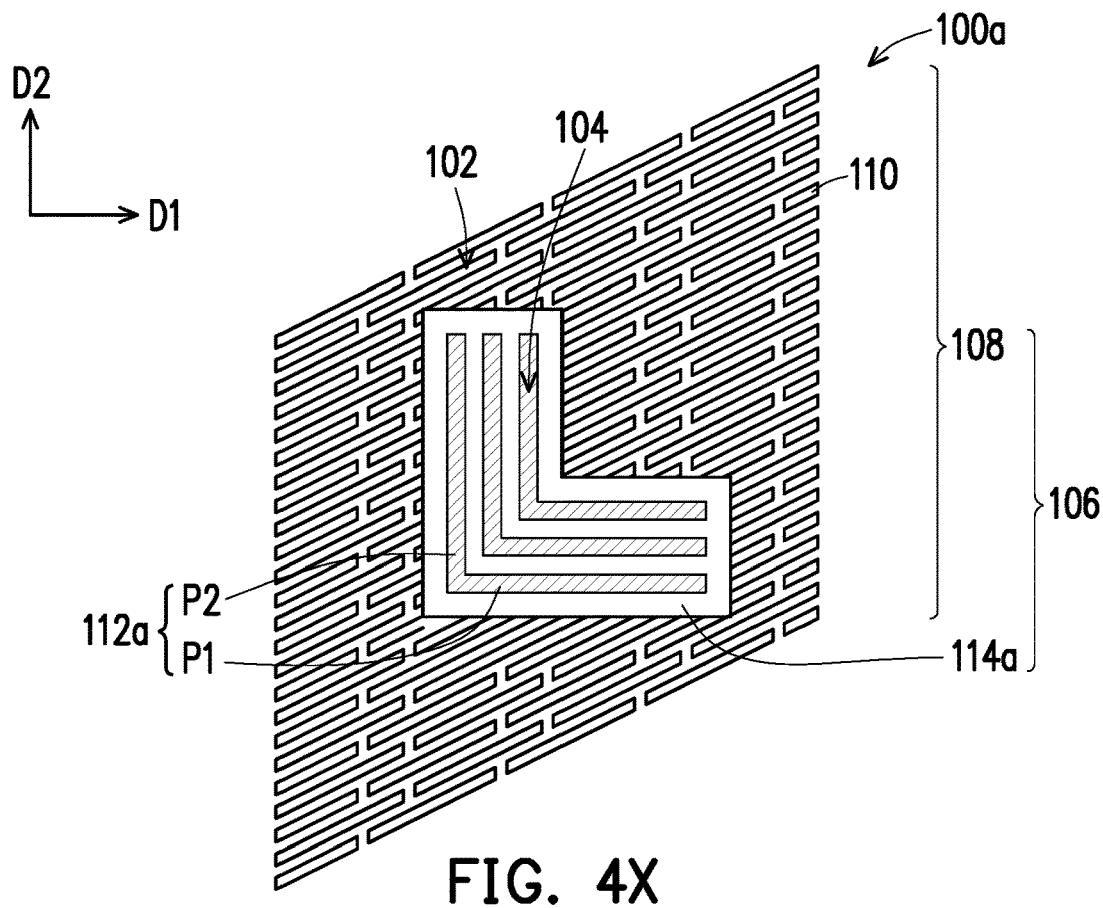

FIG. 4A to FIG. 4X are schematic views of a monitoring structure for a critical dimension of a lithography process according to some other embodiments of the invention.

Referring to FIG. 4A to FIG. 4X and FIG. 1A to FIG. 1X simultaneously, a monitoring structure 100a illustrated in FIG. 4A to FIG. 4X corresponds to the monitoring structure 100 illustrated in FIG. 1A to FIG. 1X, respectively. The difference between the monitoring structure 100a illustrated in FIG. 4A to FIG. 4X and the monitoring structure 100 illustrated in FIG. 1A to FIG. 1X is as below. In the monitoring structure 100a illustrated in FIG. 4A to FIG. 4X, the number of monitoring marks 112a may be plural, a plurality of first portions P1 of the plurality of monitoring marks 112a may be parallel to one another, and a plurality of second portions P2 of the plurality of monitoring marks 112a may be parallel to one another. A shape of the monitoring marks 112a illustrated in FIG. 4A to FIG. 4X is, for example, an L-like shape, and a shape of pad patterns 114a illustrated in FIG. 4A to FIG. 4X is, for example, an L-like shape, but the invention is not limited thereto. In addition, the same elements in the monitoring structure 100a illustrated in FIG. 4A to FIG. 4X and the monitoring structure 100 illustrated in FIG. 1A to FIG. 1X are represented by the same or similar symbols while the descriptions thereof are omitted.

According to the above embodiments, in the monitoring structure 100a for the critical dimension of the lithography process, because the dummy pattern 106 is located under the monitoring marks 112a, an environment under the monitoring marks 112a may be similar to that of the chip region R. Thereby, the uniformity of the critical dimension for the monitoring marks 112a above different locations of the wafer W may be effectively improved, and the misjudgment caused by the poor uniformity of the critical dimension for the monitoring marks 112a may be prevented. In this way, the critical dimension of the lithography process can be effectively monitored and controlled, and whether the process capability of the machine (e.g., the exposure apparatus) is varied may be determined.

Based on the above, the monitoring structure for the critical dimension of the lithography process of the embodiments set forth above can effectively improve the uniformity of the critical dimension for the monitoring marks, such that the critical dimension of the lithography process can be effectively monitored and controlled, and whether the process capability of the machine is varied can be determined.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A monitoring structure for a critical dimension of a lithography process, comprising:
   a dummy pattern layer, comprising a dummy pattern, wherein the dummy pattern comprises an array-like pattern, and the array-like pattern comprises a plurality of unit patterns; and
   a patterned photoresist layer, comprising at least one monitoring mark located above the dummy pattern, wherein the at least one monitoring mark comprises a first portion and a second portion that intersect each other, the first portion extends in a first direction, the second portion extends in a second direction, and the first direction intersects the second direction.

2. The monitoring structure for the critical dimension of the lithography process according to claim 1, wherein the dummy pattern comprises a physical portion of the dummy pattern layer.

3. The monitoring structure for the critical dimension of the lithography process according to claim 1, wherein the dummy pattern comprises an opening in the dummy pattern layer.

4. The monitoring structure for the critical dimension of the lithography process according to claim 1, wherein lengths of the plurality of unit patterns are the same.

5. The monitoring structure for the critical dimension of the lithography process according to claim 1, wherein the plurality of unit patterns comprise a part having the same length and a part having different lengths.

6. The monitoring structure for the critical dimension of the lithography process according to claim 1, wherein the array-like pattern comprises a horizontal line array, and an extension direction of the plurality of unit patterns in the horizontal line array is parallel to the first direction.

7. The monitoring structure for the critical dimension of the lithography process according to claim 1, wherein the array-like pattern comprises a vertical line array, and an extension direction of the plurality of unit patterns in the vertical line array is perpendicular to the first direction.

8. The monitoring structure for the critical dimension of the lithography process according to claim 1, wherein the array-like pattern comprises a slash line array, and an extension direction of the plurality of unit patterns in the slash line array intersects the first direction in a non-orthogonal manner.

9. The monitoring structure for the critical dimension of the lithography process according to claim 1, wherein the dummy pattern further comprises a pad pattern, a size of the pad pattern is greater than a size of the at least one monitoring mark, the at least one monitoring mark is located directly above the pad pattern, and a projection of the at least one monitoring mark completely falls on the pad pattern.

10. The monitoring structure for the critical dimension of the lithography process according to claim 9, wherein the pad pattern and the at least one monitoring mark have a same shape.

11. The monitoring structure for the critical dimension of the lithography process according to claim 9, wherein the pad pattern and a part of the array-like pattern are connected with each other.

12. The monitoring structure for the critical dimension of the lithography process according to claim 1, wherein a shape of the at least one monitoring mark comprises a cross-like shape or an L-like shape.

13. The monitoring structure for the critical dimension of the lithography process according to claim 1, wherein the at least one monitoring mark covers a part of the dummy pattern.

14. The monitoring structure for the critical dimension of the lithography process according to claim 1, wherein the at least one monitoring mark comprises a physical portion of the patterned photoresist layer.

15. The monitoring structure for the critical dimension of the lithography process according to claim 1, wherein the at least one monitoring mark comprises an opening in the patterned photoresist layer.

16. The monitoring structure for the critical dimension of the lithography process according to claim 1, wherein the number of the at least one monitoring mark is plural, the plurality of first portions of the plurality of monitoring marks are parallel to one another, and the plurality of second portions of the plurality of monitoring marks are parallel to one another.

17. The monitoring structure for the critical dimension of the lithography process according to claim 1, wherein the first direction is perpendicular to the second direction.

18. A monitoring structure for a critical dimension of a lithography process, comprising:
   a dummy pattern layer, comprising a dummy pattern, wherein the dummy pattern comprises an array-like pattern; and
   a patterned photoresist layer, comprising at least one monitoring mark located above the dummy pattern, wherein the at least one monitoring mark comprises a first portion and a second portion that intersect each other, the first portion extends in a first direction, the second portion extends in a second direction, and the first direction intersects the second direction,
   wherein the dummy pattern further comprises a pad pattern, a size of the pad pattern is greater than a size of the at least one monitoring mark, the at least one monitoring mark is located directly above the pad pattern, and a projection of the at least one monitoring mark completely falls on the pad pattern.

19. The monitoring structure for the critical dimension of the lithography process according to claim 18, wherein the pad pattern and the at least one monitoring mark have a same shape.

20. The monitoring structure for the critical dimension of the lithography process according to claim 18, wherein the pad pattern and a part of the array-like pattern are connected with each other.

* * * * *